US010274525B2

(12) United States Patent
Savvides et al.

(10) Patent No.: US 10,274,525 B2
(45) Date of Patent: *Apr. 30, 2019

(54) CONSUMPTION BREAKDOWN MONITORING THROUGH POWER STATE SENSING

(71) Applicant: YALE UNIVERSITY, New Haven, CT (US)

(72) Inventors: Andreas Savvides, Hamden, CT (US); Deokwoo Jung, Seoul (KR)

(73) Assignee: Yale University, New Haven, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/363,750

(22) Filed: Nov. 29, 2016

(65) Prior Publication Data
US 2017/0146576 A1 May 25, 2017

Related U.S. Application Data

(63) Continuation of application No. 13/641,013, filed as application No. PCT/US2011/032737 on Apr. 15, 2011, now Pat. No. 9,506,963.
(Continued)

(51) Int. Cl.
*H02J 3/14* (2006.01)
*G01R 21/133* (2006.01)
(Continued)

(52) U.S. Cl.
CPC ......... *G01R 21/1333* (2013.01); *G06Q 50/06* (2013.01); *H02J 3/14* (2013.01);
(Continued)

(58) Field of Classification Search
CPC .......... H02J 3/14; H02J 13/0017; H02J 13/00; H02J 2003/143; G01R 21/1333; G06Q 50/06
See application file for complete search history.

(56) References Cited

U.S. PATENT DOCUMENTS 9,506,963 B2 * 11/2016 Savvides ............... G06Q 50/06
2005/0222784 A1 10/2005 Tuff et al.
(Continued)

FOREIGN PATENT DOCUMENTS

WO WO-2011/130670 A2 10/2011

OTHER PUBLICATIONS

International Search Report and Written Opinion were dated Nov. 1, 2011 for International Application No. PCT/US2011/032737, which was filed on Apr. 15, 2011 and published as WO 2011/130670 on Oct. 20, 2011 (Inventor—Savvides et al; Applicant—Yale University) (10 pages).
(Continued)

*Primary Examiner* — Bryan Bui
(74) *Attorney, Agent, or Firm* — Ballard Spahr LLP

(57) ABSTRACT

Systems and methods are provided for estimating power breakdowns for a set of one or more appliances inside a building by exploiting a small number of power meters and data indicative of binary power states of individual appliances of such set. In one aspect, a breakdown estimation problem is solved within a tree configuration, and utilizing a single power meter and data indicative of binary power states of a plurality of appliances. Based at least in part on such solution, an estimation quality metric is derived. In another aspect, such metric can be exploited in a methodology for optimally placing additional power meters to increase the estimation certainty for individual appliances to a desired or intended level. Estimated power breakdown and energy breakdown—individually or collectively referred to as consumption breakdown—rely on measurements and numerical simulations, and can be evaluated in exemplary electrical network utilizing binary sensors.

29 Claims, 21 Drawing Sheets

Related U.S. Application Data

(60) Provisional application No. 61/324,371, filed on Apr. 15, 2010.

(51) Int. Cl.
    *G06Q 50/06*     (2012.01)
    *H02J 13/00*     (2006.01)

(52) U.S. Cl.
    CPC ..... *H02J 13/0017* (2013.01); *H02J 2003/143* (2013.01); *Y02B 90/2607* (2013.01); *Y04S 10/527* (2013.01); *Y04S 40/12* (2013.01)

(56) References Cited

U.S. PATENT DOCUMENTS

| | | | |
|---|---|---|---|
| 2005/0223250 | A1 | 10/2005 | Paver |
| 2006/0259447 | A1 | 11/2006 | Kings et al. |
| 2009/0006012 | A1 | 1/2009 | Kawabe |
| 2010/0070216 | A1 | 3/2010 | Murata |
| 2012/0215369 | A1* | 8/2012 | Desai .................... G06Q 10/06 700/291 |

OTHER PUBLICATIONS

International Preliminary Report on Patentability was dated Oct. 16, 2012 for International Application No. PCT/US2011/032737, which was filed on Apr. 15, 2011 and published as WO 2011/130670 on Oct. 20, 2011 (Inventor—Savvides et al; Applicant—Yale University) (5 pages).

Preliminary Amendment was dated Oct. 12, 2012 to the U.S. Patent and Trademark Office for U.S. Appl. No. 13/641,013, filed May 23, 2013 and now U.S. Pat. No. 9,506,963 on Nov. 29, 2016 (Inventor; Savvides et al; Applicant—Yale University) (4 pages).

Preliminary Amendment was dated Jul. 22, 2013 to the U.S. Patent and Trademark Office for U.S. Appl. No. 13/641,013, filed May 23, 2013 and now U.S. Pat. No. 9,506,963 on Nov. 29, 2016 (Inventor; Savvides et al; Applicant—Yale University) (3 pages).

Non Final Rejection was dated Dec. 24, 2015 by the U.S. Patent and Trademark Office for U.S. Appl. No. 13/641,013, filed May 23, 2013 and now U.S. Pat. No. 9,506,963 on Nov. 29, 2016 (Inventor; Savvides et al; Applicant—Yale University) (5 pages).

Response to Non Final Rejection was dated May 23, 2016 to the U.S. Patent and Trademark Office for U.S. Appl. No. 13/641,013, filed May 23, 2013 and now U.S. Pat. No. 9,506,963 on Nov. 29, 2016 (Inventor; Savvides et al; Applicant—Yale University) (8 pages).

Notice of Allowance was dated Jul. 20, 2016 by the U.S. Patent and Trademark Office for U.S. Appl. No. 13/641,013, filed May 23, 2013 and now U.S. Pat. No. 9,506,963 on Nov. 29, 2016 (Inventor; Savvides et al; Applicant—Yale University) (7 pages).

Amendment after Notice of Allowance was dated Jul. 22, 2016 to the U.S. Patent and Trademark Office for U.S. Appl. No. 13/641,013, filed May 23, 2013 and now U.S. Pat. No. 9,506,963 on Nov. 29, 2016 (Inventor; Savvides et al; Applicant—Yale University) (3 pages).

Issue Notification was dated Nov. 9, 2016 by the U.S. Patent and Trademark Office for U.S. Appl. No. 13/641,013, filed May 23, 2013 and now U.S. Pat. No. 9,506,963 on Nov. 29, 2016 (Inventor; Savvides et al; Applicant—Yale University) (1 page).

\* cited by examiner

*← 700*

| Estimate $\hat{\mathbf{E}}$ from $\mathbf{X}$ and $\mathbf{Y}$ for $T_{est}$ |
|---|
| Require: $Rank(\mathbf{X}) \geq p$ |
| Ensure: $\|\mathbf{Y}(t) - \hat{\mathbf{Y}}(t)\| \approx 0$ |
| 1:   Create Table $\mathbf{TB} = [\mathbf{W}|\mathbf{X}|\hat{\mathbf{Y}}]$ |
| 2:   for each power meter sample, $y(t)$ do |
| 3:       Update a queue, $\mathbf{Q}_k$ in $\mathbf{TB}$ given $\mathbf{x}(t) = \mathbf{x}_k$ |
| 4:       if $t \% T_{est} = 0$ then |
| 5:          Estimate $\alpha^2$ by solving (11) |
| 6:          Estimate $\hat{\mathbf{P}}_{cma}$ and $\hat{\mathbf{P}}_{cur}$ by solving (8) |
| 7:          for $1 \leq i \leq p$ do |
| 8:             if $\widehat{MSE}(\hat{\mathbf{P}}_{cma}(i)) < \widehat{MSE}(\hat{\mathbf{P}}_{cur}(i))$ then |
| 9:               $\hat{\mathbf{P}}_{opt}(i) = \hat{\mathbf{P}}_{cma}(i)$ |
| 10:            else |
| 11:                $\hat{\mathbf{P}}_{opt}(i) = \hat{\mathbf{P}}_{cur}(i)$ |
| 12:            end if |
| 13:            return $\hat{\mathbf{E}}(i) = \hat{\mathbf{P}}_{opt}(i) \left( \sum_{\tau = t - T_{est}}^{t} x_i(\tau) \right)$ |
| 14:          end for |
| 15:          Reset $ptr_k$ |
| 16:       end if |
| 17: end for |

FIG. 7

CONSUMPTION BREAKDOWN MONITORING THROUGH POWER STATE SENSING

CROSS-REFERENCE TO RELATED APPLICATIONS

The subject patent application is a continuation of U.S. patent application Ser. No. 13/641,013, filed May 23, 2013, which is a National Phase Application of International Patent Application No. PCT/US2011/032737, filed Apr. 15, 2011, which claims priority to U.S. Provisional Patent Application No. 61/324,371, filed Apr. 15, 2010. These applications are incorporated by reference herein in their entirety.

STATEMENT REGARDING FEDERALLY SPONSORED RESEARCH

This invention was made with government support under 0715180 awarded by the National Science Foundation. The government has certain rights in the invention.

SUMMARY

The subject disclosure relates to monitoring power breakdown and energy breakdown for appliances in an electrical network through power state sensing. In one or more embodiments, systems and methods are provided for estimating power breakdowns for a set of one or more appliances inside a building by exploiting a small number of power meters and data indicative of binary (e.g., ON or OFF) power states of individual appliances of such set. In one aspect, a breakdown estimation problem is solved within a tree configuration, and utilizing a single power meter and data indicative of binary power states of a plurality of appliances. Based at least in part on such solution, an estimation quality metric is derived. In another aspect, such metric can be exploited in a methodology for optimally placing additional power meters to increase the estimation certainty for individual appliances to a desired or intended level. Estimated power breakdown and energy breakdown—individually or collectively referred to as consumption breakdown—relies on measurements and numerical simulations. Estimated consumption breakdown can be evaluated in an exemplary (e.g., a scaled-down prototypical) electrical network utilizing binary sensors.

In one aspect, an exemplary method is provided, which can comprise: (i) collecting, at a predetermined sampling interval, data indicative of power consumption of at least one appliance of a plurality of appliances from at least one power meter, wherein a number of power meters of the at least one power meter is less than a number of outlets of a plurality of outlets coupled to the plurality of appliances; (ii) collecting, over a first time interval, data indicative of a time-stamped set of binary power states of a plurality of appliances, wherein a binary power state is an ON power state or an OFF power state; and (iii) estimating an energy consumption of at least one appliance of the plurality of appliances over the first time interval. In another aspect, the exemplary method can comprise repeating steps (i) through (iii) during a second time interval greater than the first time interval.

In another aspect, a system is provided, wherein the exemplary system can comprise a memory comprising data and computer-executable instructions; and a processor functionally coupled to the memory and configured by the computer-executable instructions to perform steps comprising: (a) collecting, at a predetermined sampling interval, data indicative of power consumption of at least one appliance of a plurality of appliances from at least one power meter, wherein a number of power meters of the at least one power meter is less than a number of outlets of a plurality of outlets coupled to the plurality of appliances; (b) collecting over a first period data indicative of a time-stamped set of binary power states of a plurality of appliances, wherein a binary power state is an ON power state or an OFF power state; and (c) estimating an energy consumption of at least one appliance of the plurality of appliances over a second period. Optionally, in this aspect, the processor can be configured to perform the step of repeating steps (a) through (c) during a second time interval greater than the first time interval.

In yet another aspect, an exemplary computer-readable non-transitory medium is provided. The exemplary computer-readable non-transitory medium comprising: a first group of computer-executable instructions that, in response to execution, cause a processor to collect, at a predetermined sampling interval, data indicative of power consumption of at least one appliance of a plurality of appliances from at least one power meter, wherein a number of power meters of the at least one power meter is less than a number of outlets of a plurality of outlets coupled to the plurality of appliances; a second group of computer-executable instructions that, in response to execution, cause a processor to collect, over a predetermined time interval, data indicative of a time-stamped set of binary power states of a plurality of appliances, wherein a binary power state is an ON power state or an OFF power state; and a third group of computer-executable instructions that, in response to execution, cause the processor to estimate an average energy consumption of at least one appliance of the plurality of appliances over the predetermined time interval.

Additional aspects, features, or advantages of the subject disclosure will be set forth in part in the description which follows, and in part will be obvious from the description, or can be learned by practice of the subject disclosure. The advantages of the subject disclosure will be realized and attained by means of the elements and combinations particularly pointed out in the appended claims. It is to be understood that both the foregoing general description and the following detailed description are exemplary and explanatory only and are not restrictive of the subject disclosure.

BRIEF DESCRIPTION OF THE DRAWINGS

The accompanying drawings are incorporated and illustrate exemplary embodiment(s) of the subject disclosure and together with the description and claims appended hereto serve to explain various principles, features, or aspects of the subject disclosure.

FIG. 7 illustrates an example method for estimating energy breakdown through power state sensing in accordance with aspects of the subject disclosure.

FIG. 15A presents relative error of the average active power consumption of an exemplary appliance, and FIG. 15B presents estimation performance metrics for average active power consumption and total power consumption.

DETAILED DESCRIPTION

Figure 1:
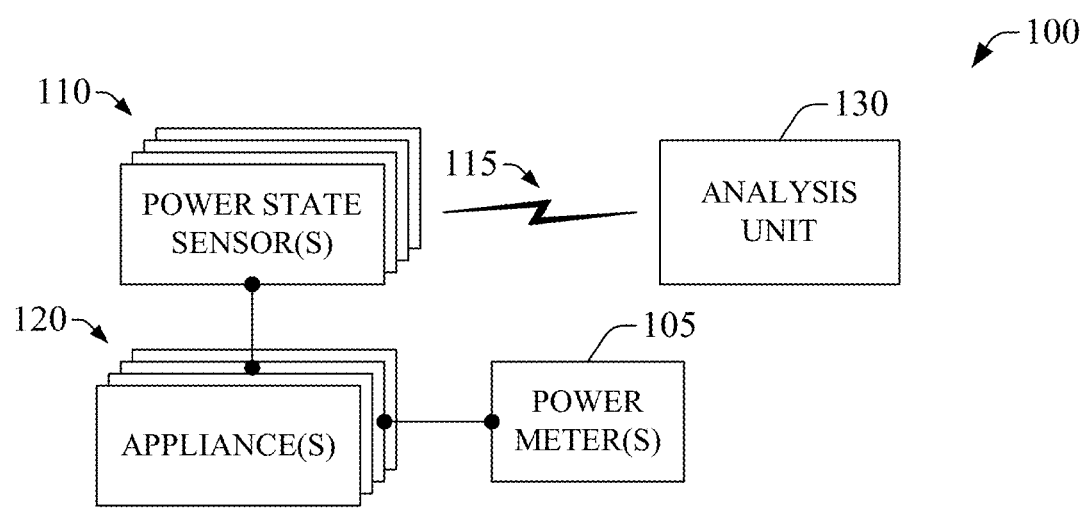
FIG. 1 illustrates a high-level block diagram of an exemplary system for monitoring power breakdown through appliance power state sensing in accordance with aspects of the subject disclosure.

The subject disclosure can be understood more readily by reference to the following detailed description of exemplary embodiments of the subject disclosure and to the Figures and their previous and following description.

Before the present compounds, compositions, articles, systems, devices, and/or methods are disclosed and described, it is to be understood that the subject disclosure is not limited to specific systems and methods for monitoring power breakdown of apparatuses through binary state sensing. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

In the subject specification and in the claims which follow, reference can be made to a number of terms which shall be defined to have the following meanings: "Optional" or "optionally" means that the subsequently described event or circumstance can or cannot occur, and that the description includes instances where said event or circumstance occurs and instances where it does not.

As employed in this specification and annexed drawings, the terms "unit," "component," "interface," "system," "platform," and the like are intended to include a computer-related entity or an entity related to an operational apparatus with one or more specific functionalities, wherein the computer-related entity or the entity related to the operational apparatus can be either hardware, a combination of hardware and software, software, or software in execution. One or more of such entities are also referred to as "functional elements." As an example, a unit can be, but is not limited to being, a process running on a processor, a processor, an object, an executable computer program, a thread of execution, a program, a memory (e.g., a hard disc drive), and/or a computer. As another example, a unit can be an apparatus with specific functionality provided by mechanical parts operated by electric or electronic circuitry which is operated by a software or a firmware application executed by a processor, wherein the processor can be internal or external to the apparatus and executes at least a part of the software or firmware application. In addition or in the alternative, a unit can provide specific functionality based on physical structure or specific arrangement of hardware elements. As yet another example, a unit can be an apparatus that provides specific functionality through electronic functional elements without mechanical parts, the electronic functional elements can include a processor therein to execute software or firmware that provides at least in part the functionality of the electronic functional elements. An illustration of such apparatus can be control circuitry, such as a programmable logic controller. The foregoing example and related illustrations are but a few examples and are not intended to be limiting. Moreover, while such illustrations are presented for a unit, the foregoing examples also apply to a component, a system, a platform, and the like. It is noted that in certain embodiments, or in connection with certain aspects or features thereof, the terms "unit," "component," "system," "interface," "platform" can be utilized interchangeably.

Throughout the description and claims of this specification, the words "include," "have," "comprise" and variations of those words, such as "including" and "includes," "having" and "has," and "comprising" and "comprises," mean "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Reference will now be made in detail to the various embodiment(s), aspects, and features of the subject disclosure, example(s) of which are illustrated in the accompanying drawings. Wherever possible, the same reference numbers are used throughout the drawings to refer to the same or like parts.

The subject disclosure relates to systems and a methodology for estimating consumption breakdowns with appliance power state sensing. In one aspect, such sensing can be lightweight, mitigating costs and thus increasing adoption. In certain embodiments, breakdown of dynamic consumption components inside a building can be estimated utilizing mainly data indicative of total consumption (e.g., power consumption, energy consumption, or both) and binary power state (e.g., ON state or OFF state) of appliances within the building.

As illustrated in FIG. 1, a set of one or more power state sensor(s) 110 can collect data indicative of power state of one or more appliance(s) 120. Such data collection is referred to as state sensing. In one exemplary non-limiting aspect, the one or more sensor(s) 110 can supply at least a portion of the data wirelessly (represented with link 115) to an analysis unit 130, which can process data in accordance with aspects described herein. The one or more sensor(s) 110 can be dry-contact sensors, such as sensors with radio frequency (RF) transmission functionality or more intelligent wireless sensor nodes that infer the state of an appliance from indirect sensing. Optionally, the one or more sensor(s) 110 can be magnetic field sensors. Other types of binary state sensors (or binary sensors) can be employed. In certain embodiments, data indicative of power state of an appliance can be supplied through direct human input to an interface of analysis unit 130. For large buildings, one or more methods for deploying additional energy meters to improve estimation accuracy also can be provided. In one aspect, the various embodiments of the subject disclosure can complement or supplement various conventional solutions such as processing transient load signatures, utilization of power meters at the sockets, or indirect sensing. In another aspect, the various embodiments of the subject disclosure can provide a scalable solution with lightweight sensing that also can be complemented by external input (e.g., human agent input). In yet another aspect, the various embodiments of the subject disclosure are general and can be applied to residential electrical networks where human agents can enter state information manually into a system for monitoring power consumption or energy consumption. In addition, one or more embodiments described herein can be employed to monitor power consumption in electrical networks of increasing deployment and operational complexity such as those networks in large buildings wherein a large network of sensors can provide a low-cost retrofit solution for monitoring power consumption.

One or more embodiments of the subject disclosure can address several facets of the problem of monitoring power and energy consumption. In one illustrative facet, a power consumption profile for an individual appliance may not always be constant; for instance, a certain light bulb can have a nearly constant power consumption of 60 W whereas a washing machine or a refrigerator may have a fluctuating power consumption during the time such apparatuses are in the ON state. In another illustrative facet, ON or OFF states of appliances generally cannot be actively controlled in order to condition dataset(s) related to power consumption and thus system(s) and related method(s) of the subject disclosure can handle substantive ambiguity in the data.

The subject disclosure provides systems and methods that can estimate, periodically or otherwise, consumption breakdowns by incorporating variations in loads and diversity in an appliance's power state dataset. In certain embodiments, at each cycle in a power consumption monitoring stage, one of two estimates can be selected, wherein the two estimates are computed from two alternative datasets; the selected estimate can be the one with the highest confidence based on a predetermined data quality metric. As a result, in one aspect, such certain embodiments enable a lightweight setup that can mitigate or avoid exhaustive deployment of power meters on all appliances (e.g., appliance(s) 120) in an electrical network. In additional or alternative embodiments, in larger appliance deployments, a predetermined level of confidence, or certainty, can be achieved through an incremental algorithm for deploying additional meters in certain location(s) within the electrical networks embodied in such appliance deployments. In one aspect, such embodiments can decompose a binary dataset into non-empty subsets according to a topology of electrical outlets, and can optionally seek to maximize diversity of the appliance power state dataset by incrementally deploying additional meters. In certain embodiments, results obtained through implementation of the various methods described can be validated with real datasets collected from exemplary testbeds.

In one aspect, to estimate consumption breakdowns per unit time, the total power consumption is assumed to be known. In one exemplary embodiment of an electrical network such consumption can be measured at a main fusebox. In one example and not meant to be limiting, consumption measurements can be performed with a The Energy Detective (TED) 5000 Series home energy monitor that can be configured to provide a stream of measurements (and related data) in XML format at a rate of 1 Hz. Other off-the-shelf power meters or OEM components for power meters also can enable measurements of power consumption and provide data indicative thereof; in certain exemplary embodiments, such data can be provided through web-based platform(s). In one or more exemplary embodiments, appliances (e.g., appliance(s) 120) are configured (e.g., instrumented) with active radiofrequency identification (RFID) dry-contact state sensors (e.g., sensor(s) 110). Such sensors detect devices' ON-to-OFF and OFF-to-ON power state changes as events, and can supply data representative of the events wirelessly to a central computer (e.g., analysis unit 130) wherein one or more readings from the home energy monitor and one or more recorded states (which can be retained in a memory of analysis unit 130) can be processed to estimate consumption breakdowns (e.g., power breakdowns, energy breakdowns, or both).

Figure 2:
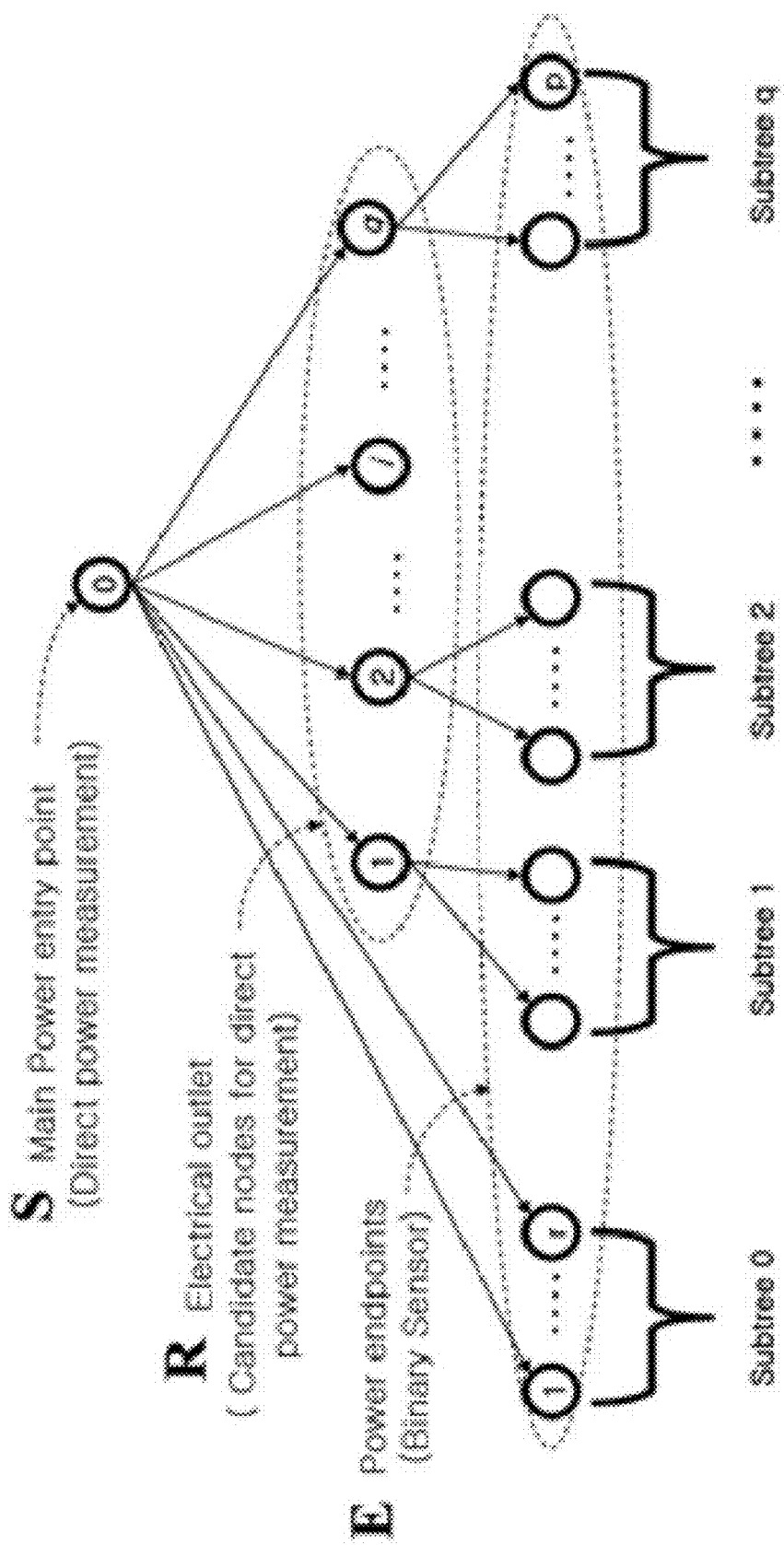
FIG. 2 is a tree representation of binary sensors and a power meter in an electrical network in a building in accordance with aspects of the subject disclosure.

In one aspect, a structure of a building electric power network can be hierarchical and it can be represented (e.g., modeled) as a three-tier tree structure (or three-tier tree) wherein power consumption at a parent node is equal to the sum of the power consumptions of its children nodes as shown in FIG. 2. It should be appreciated that the subject disclosure is not limited by the specific topology of the tree structure described herein and that it is contemplated that the various aspects and feature of the subject disclosure also can be accomplished in more elaborate tree structures.

In this example, the power meter at the main fusebox of an electrical network is located at the root of the three-tier tree, all the outlets in the electrical network are in the middle tier of the three-tier tree, and the appliances attached to the outlets are located on the leaf nodes of the three-tier tree. In one embodiment, consumption breakdown can be estimated for the scenario in which a single power meter is available in the electrical network. A metric derived from such estimate is employed to propose a method for incrementally deploying additional power meters at the middle tier of the three-tier tree so as to achieve a satisfactory (e.g., best, second best, third best, or the like) tradeoff between estimation quality and number of deployed power meters. In one aspect, sub-trees with the most uncertainty are collapsed into a single node with high certainty by inserting a power meter at that outlet.

In the subject disclosure, achievement of a good trade-off between deployment costs and computed consumption breakdown (e.g., power breakdown, energy breakdown, or both) accuracies is pursued by replacing power meters with binary power state sensors (also referred to as binary sensors). Increasing the ratio of binary sensors to power meters in an electrical network can shift operation of an energy monitoring system from direct-metering operation to indirect-metering operation.

In fundamental terms, generation of a consumption breakdown estimate in the subject disclosure is a data disaggregation problem rather than a calibration problem as cast in certain conventional systems. In one aspect, a primary goal of the various embodiments of the subject disclosure is to estimate the energy consumption breakdown of appliances rather than reconstructing their (fine-grained) power consumption profiles. In another aspect, the various embodiments of the subject disclosure enable development of a scalable and computationally efficient estimation method. One exemplary advantage of using binary sensors, or binary sensing, is that such sensors afford simpler installation and have increased suitability for large buildings in comparison to other types of sensors, which can generally be more difficult to install—for example, installing (e.g., deploying, configuring, or deploying and configuring) a plug sensor on the air handlers of a heat ventilation and air conditioning (HVAC) unit cannot be accomplished easily in most cases. Another exemplary advantage of using binary sensors is that such sensors can avoid sending raw sensor measurement data to a data center, as opposed to certain conventional technologies. In addition, binary sensors not only are cheaper that other types of metering components but in the subject disclosure, binary sensors can perform thresholding to detect both ON-to-OFF and OFF-to-ON transitions. In another aspect, in larger buildings, data indicative of ON-to-OFF and OFF-to-ON events can be collected directly from an automation system of the building, which can render the various embodiments of the subject disclosure suitable as a retrofit solution that can mitigate or avoid additional equipment deployment.

Figure 3:
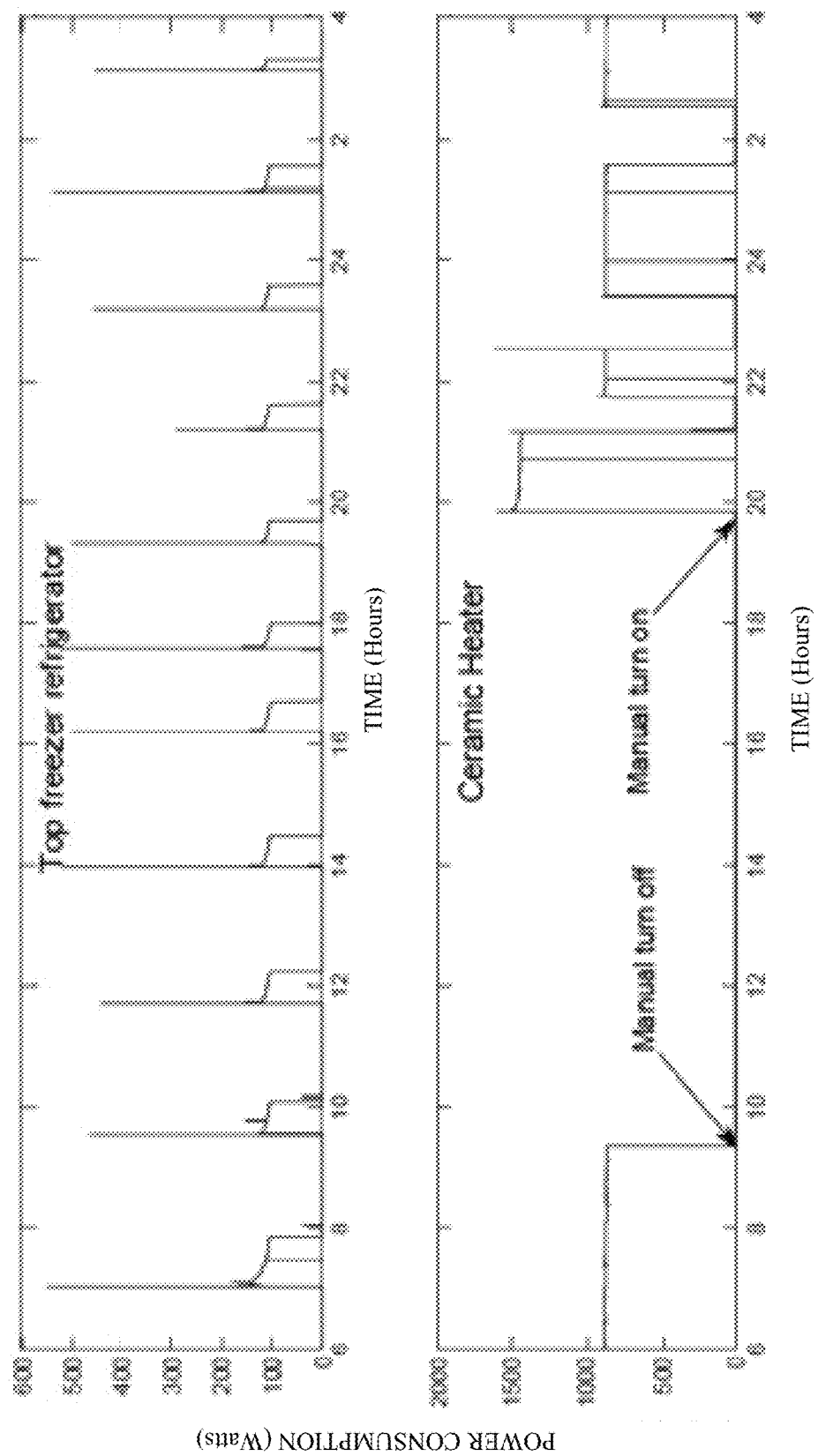
FIG. 3 is a power consumption profile of exemplary appliances (top freezer refrigerator (top panel) and ceramic heater (bottom panel)) in accordance with aspects of the subject disclosure.

Estimating the energy usage breakdown generally is equivalent to estimating average power consumption per appliance over a given observation time. Therefore, in one aspect, instead of making direct consumption measurements and then averaging them, it is contemplated that the average is computed directly through the knowledge of the aggregate consumption and appliance binary power state. In certain embodiments, average consumption is attempted to be estimated accurately over short time intervals, accounting for non-uniformities in power consumption of certain energy appliances during their ON state. As an example, FIG. 3 illustrates typical power consumption profiles for a top freezer refrigerator and a temperature-controlled ceramic heater. In the scenario illustrated in FIG. 3, the top freezer refrigerator presents a consistent periodic power consumption pattern driven by the ON and OFF states of the refrigerator's compressor, wherein such ON and OFF states are driven by a controller component (or controller) embedded in the refrigerator. In contrast, the temperature-controlled ceramic heater has a less consistent power profile mainly because the ON-to-OFF and OFF-to-ON events can be initiated by both a human agent and a controller component (or controller). In the illustrated scenario, the temperature-controlled ceramic heater is turned off manually at around 9:00 am and it is turned back on at around 8:00 pm. As illustrated, the ceramic heater initially can consume more power to reach a target temperature than the power consumed to maintain the target temperature.

Figure 4:
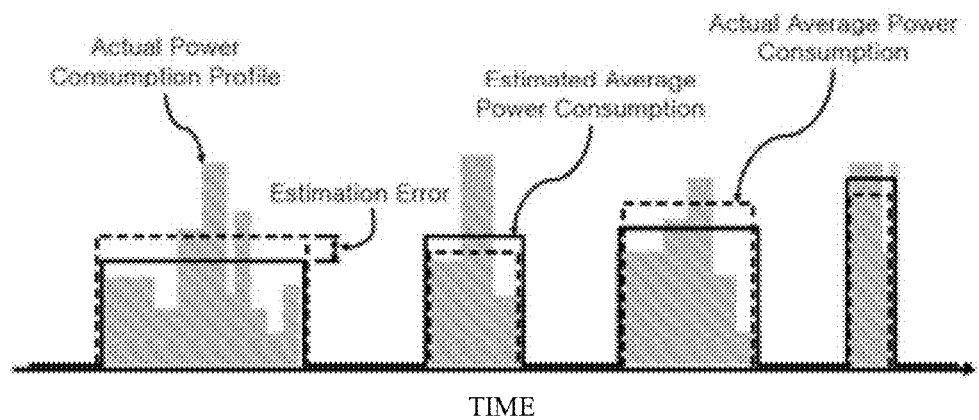
FIG. 4 illustrates exemplary values of estimated and actual power consumption of an appliance in accordance with aspects of the subject disclosure.

Features of power consumption in the exemplary scenario illustrated in FIG. 3 suggest that in the absence of explicit sub-metering, a consumption breakdown estimation method is to compute adaptively the average power consumption over the duration of each ON state resulting from an OFF-to-ON event for each appliance as in the example presented in FIG. 4. Although the power consumption fluctuates over the ON state, an analysis unit (e.g., unit 130) that implements an estimation method according to aspects described herein can seek to compute an average power consumption, shown with a solid line in FIG. 4, over the ON state interval. Such power fluctuation is referred to as the non-stationary property of active power profiles. In one aspect, the analysis unit can pursue the goal of minimizing an estimation error, which can be defined as the difference between estimated and actual average power consumption for the ON state duration.

It should be appreciated that the estimation problem generally is complex in view of the collinearity of a binary state dataset and the non-stationary property of active power profiles. For example, in a limiting scenario in which a single appliance is ON at a specific time, the binary state dataset has zero collinearity and an estimate of power consumption can be accurate. However, in one alternative limiting scenario in which all appliances in an electrical network are switched ON at substantially the same time, it is significantly more difficult to discern average power consumption for individual appliances based at least on the binary power state (e.g., ON state or OFF state) dataset.

The foregoing limiting scenarios indicate an important tradeoff that an analysis unit (e.g., unit 130) that implements (e.g., executes) the methods described herein can seek to exploit. If the power profile of an appliance is stationary, power consumption can be estimated more accurately if more data is collected by extending the estimation period. However, if devices have many power modes (e.g., less stationary profiles) then accuracy of a power consumption estimate can be higher if the estimation period is smaller and less binary state data samples are considered. Stated similarly, yet not identically, an average power consumption typically always can be estimated if we observe the power profile for a sufficiently long period of time. However, if a power profile is non-stationary, an observation time may not improve estimation accuracy. In one aspect, utilizing data observed during an estimation period can generate better estimates than those generated utilizing a whole observed dataset.

In the limiting scenario in which a single appliance is ON at any specific time and all appliances have stationary loads, consumption breakdowns can be computed accurately using only binary knowledge of ON states and OFF states (e.g., data indicative of binary power states) and a single power meter at the building's main fusebox. In non-limiting cases, more particular to actual appliance operation, an electrical appliance generally has a degree of collinearity and non-stationary power profiles. These can compromise performance rapidly as more devices are added to an electrical network. Embodiments of the subject disclosure attempt to mitigate or avoid such issue by dynamically selecting an appropriate time window to consume the binary state measurements based at least on the diversity of the observed dataset. In one aspect, mitigation or avoidance of estimation performance degradation can be accomplished by evaluating an estimation quality metric.

In scenarios in which an intended (e.g., required) estimation accuracy may not be reached, the various embodiments of the subject disclosure provide a method that exploits an estimation quality metric to determine a location within an electrical network where an additional power meter can be placed in order to increase a current estimation accuracy. In one aspect, determination of such a location can be performed incrementally in the number of additional power meters. For instance, a number of added power meters can be increased by one power meter at a time until the intended (e.g., required) accuracy is achieved with a minimal number of additional power meters.

Figure 5:
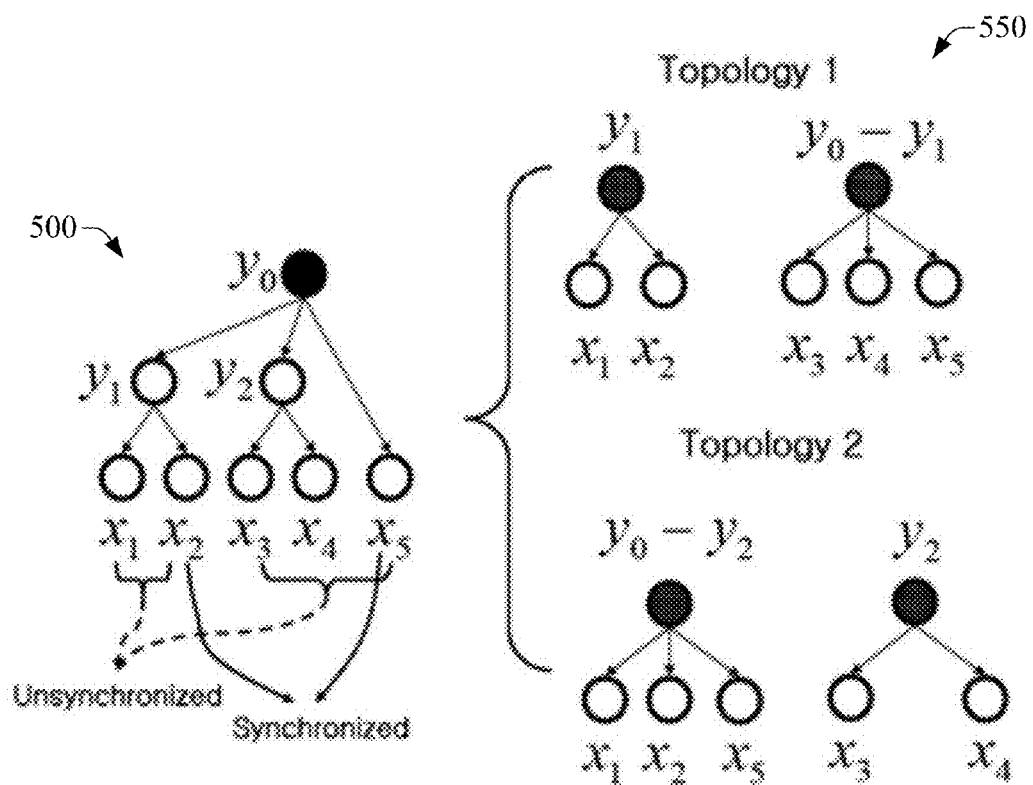
FIG. 5 illustrates an exemplary power meter topology in an electricity network within a building in accordance with aspects of the subject disclosure.

FIG. 5 illustrates an example of a power meter placement scheme. In diagram 500, an exemplary system (e.g., exemplary system 100) representing an electrical network has a main power entry point $y_0$, two electrical outlets $\{y_1, y_2\}$, and five appliances $\{x_1, x_2, x_3, x_4, x_5\}$ organized as a tree topology (see also FIG. 2). The solid (black) node denotes the presence of a power meter at that node. In the layout of diagram 500, when a desired (e.g., required) certainty, or value of an estimation quality metric, is not reached, a power meter can be added at one of the outlets $y_1$ or $y_2$. Diagram 550 illustrates two alternative topologies (Topology 1 and Topology 2) that incorporate an additional power meter (represented by a solid node). Although both topologies have the same number of sub-trees (e.g., two sub-trees) and leaf nodes (e.g., five leaf nodes), their binary state data quality can differ. For example, if we assume that two disparate ON/OFF sequences of appliances in each set of appliances $\{x_1, x_2\}$ and $\{x_3, x_4, x_5\}$ are substantially perfectly unsynchronized to each other while substantially perfectly synchronized for $\{x_2, x_5\}$, then the average power consumption of each appliance can be estimated without error for Topology 1 since the binary power state of appliances in each sub-tree changes one at a time. In Topology 2, however, computation of the average power consumption of $x_2$ and $x_5$ generally is more challenging because ON/OFF state changes of such appliances are completely overlapped.

In one aspect, by solving the foregoing problem of incremental deployment of power meter(s) utilizing binary state data observations and an estimate quality metric, the various embodiments of the subject disclosure can avoid exhaustive measurement of power consumption at each outlet in order to evaluate estimation performance. Instead, estimation performance at each sub-tree can be predicted from observed binary sensor data. In this aspect, estimation performance at a sub-tree can be accomplished by computing a data quality metric using a single power meter at the root node of a hierarchical tree, and utilizing the data quality metric to direct deployment of additional power meters in the hierarchical tree. For example and without limitation, such process to determine deployment of additional power meters can formally collapse a low-certainty sub-tree into a single high-certainty node through the addition of a power meter at the root node of the low-certainty sub-tree.

In one aspect, the various embodiments of the subject disclosure can solve a breakdown estimation problem, which can be stated as follows: Provided a time-stamped dataset of binary power states for all appliances and their cumulative power consumption measured at a main fusebox in an electrical network, estimate an average energy consumption of each appliance over a specific time interval.

In the subject disclosure it is assumed that the number of appliances in an electrical network is p (a natural number), and that for each ith appliance ON and OFF binary data $x_i(t) \in [0,1]$ and actual total power consumption $P_i(t) \in R^+$ of the plurality of p appliances at time t is available, where $i \in \{1, 2 \ldots p\}$. It should be appreciated that ON state can be assigned a value of "1" and OFF state can be assigned a value of "0," or vice versa. The p-tuple for the ON/OFF states of leaf nodes (or appliances) at time t by the column vector is denoted by $x(t) = [x_1(t) \ldots x_p(t)]^T$. Furthermore, it is assumed that two or more appliances with strongly correlated ON or OFF states are considered as a single appliance, e.g., a desktop computer and its liquid crystal display (LCD) monitor are considered collectively as a computer.

The various embodiments of the subject disclosure can estimate average power consumption of individual appliances over a certain time period. To at least that end, in the subject disclosure, such estimation can be formulated as the optimization problem posed by Eq. (1), in which the sum of the mean square errors of the difference between the measured $\overline{P}_i[k]$ and estimated $\hat{\overline{P}}_i[k]$ active power consumption of each appliance over a given interval k is minimized.

$$\min \sum_{i=1}^{p} MSE\left(\hat{\overline{P}}_i[k]\right) = E\left[\sum_{i=1}^{p} \left(\overline{P}_i[k] - \hat{\overline{P}}_i\right)^2\right]. \quad \text{Eq. (1)}$$

The problem posed by Eq. (1) is, however, not solvable because actual consumption measurements at each ith node are generally unavailable, that is $\overline{P}_i[k]$ is unknown. Prior to describing an alternative formulation that can be readily solved, certain notation is introduced next.

In the subject disclosure, generation of a new estimate at a predetermined periodic time interval $T_{est}$ is intended, wherein such generation is based on a collection of samples from a power meter that occur in an time interval $T_s$ where $T_s$ $T_{est}$. A collection of appliance binary states (e.g., ON states, OFF states) can be collected in an event-driven manner; such collection generally is significantly slower (e.g., in the order of minutes or hours) than the total power consumption sampling interval $T_s$ at the power meter. In one embodiment, $T_{est}$ can be of the order of tens of seconds to tens of minutes, whereas $T_s$ can be of the order of one second (e.g., one data sample indicative of power consumption is collected per second). Accordingly, a substantive amount of data representative of binary power states is generated and collected. A new or current energy breakdown estimate is computed at the end of each period, $\{T_{est}, 2T_{est}, \ldots, kT_{est}, \ldots\}$, which is indexed by k (a natural number) as $t_k = \{(k-1)T_{est} + T_s, (k-1)T_{est} + 2T_s, \ldots, kT_{est}\}$. In one embodiment, analysis unit 130 can compute energy breakdown estimates. Let $\overline{P}_i[k]$ denote average active power consumption of $P_i(t)$ during the kth estimation period, which is defined in Eq. (2)

$$\overline{P}_i[k] = \frac{\sum_{i \in t_k} P_i(t) x_i(t)}{\sum_{i \in t_k} X_i(t)} \quad \text{Eq. (2)}$$

The active power profile of ith appliance is defined to be stationary if it converges the constant value $\overline{P}_i$ over a plurality of periods tending to infity, e.g., $$\lim_{k \to \infty} \overline{P}_i[k] = \overline{P}_i.$$

Otherwise, the active power profile is non-stationary.

Using the above, in one aspect, the problem can be formulated in terms of the total consumption at the root of the tree as $$\min MSE(y(t)) = E\left[\frac{1}{T}\sum_{t=t_0}^{t_0+T}(y(t) - \hat{y}(t))^2\right], \quad \text{Eq. (3)}$$

where y(t) is the measured total consumption at the root node (e.g., $y_0$) at time t, $\hat{y}(t)$ is the sum of the estimated consumption for each leaf node (or appliance) in a hierarchical tree, $t_0$ is an initial time and T is a period during which power and binary state measurements are conducted, and $E(\cdot)$ is the function that determines the expectation value of the argument. The problem posed by Eq. (3) can be solved by expressing $\hat{y}(t)$ in terms of individual power consumptions.

The instantaneous power consumption of ith appliance, $P_i(t)$ using $x_i(t)$ and $\overline{P}_i[k]$ as shown in Eq. (4):

$$P_i(t) = (\overline{P}_i[k] + \varepsilon_{i1}(t)) x_i(t) + \varepsilon_{i0}(t)(1 - x_i(t)) \quad (4)$$

where $\varepsilon_{i1}(t)$ is an error between an observed active power consumption and an expected value, and $\varepsilon_{i0}(t)$ is the vampire load consumed by an appliance while the appliance is switched off. Combining $y(t) = \Sigma_i P_i(t)$ and the model of instantaneous power consumption set forth in Eq. (4), the total power consumption at kth estimation period can be described as follows $$y(t) = \sum_{i=1}^{p}(\overline{P}_i[k] - \varepsilon_{i0}(t))x_i(t) + \sum_{i=1}^{p}\varepsilon_{i0}(t) + \sum_{i=1}^{p}\varepsilon_{i1}(t)x_i(t) \quad \text{Eq. (5)}$$

TABLE 1

Exemplary data table (DT) of nine samples of binary power states. The DT conveys ith appliance's ON/OFF state $x_i(t)$, and the total power consumption y(t) in Watts at each time t. ON states are represented by 1s and OFF states are represented by 0s.

| t | $x_2(t)$ | $x_3(t)$ | y(t) |
|---|---|---|---|
| 1 | 0 | 0 | 62 |
| 2 | 0 | 0 | 60 |
| 3 | 1 | 0 | 120 |

TABLE 1-continued

Exemplary data table (DT) of nine samples of binary power states. The DT conveys ith appliance's ON/OFF state $x_i(t)$, and the total power consumption y(t) in Watts at each time t. ON states are represented by 1s and OFF states are represented by 0s.

| t | $x_2(t)$ | $x_3(t)$ | y(t) | |
|---|---|---|---|---|
| 4 | 0 | 1 | 1 | 380 |
| 5 | 1 | 0 | 1 | 160 |
| 6 | 0 | 1 | 1 | 371 |
| 7 | 1 | 1 | 1 | 469 |
| 8 | 0 | 0 | 1 | 56 |
| 9 | 0 | 1 | 1 | 357 |

In one aspect, Eq. (5) can be further simplified by assuming that the vampire load of each appliance in the OFF state is constant, e.g., $\varepsilon_{i0}(t) = \varepsilon_{i0}$. In another aspect, it can be assumed that vampire loads are negligible compared to the power consumption of an appliance in the ON state; namely, $\overline{P}[k] - \varepsilon_{i0}(t) \approx \overline{P}[k]$. After such simplifications, the total power consumption can be described as a simple linear model, as conveyed in Eq. (6).

$$y(t) = \overline{P}_k x(t) + P_0 + e(t) \quad \text{Eq. (6)}$$

where $P_0 = \Sigma_i \varepsilon_{i0}(t)$, or the total vampire load, $e(t) = \Sigma_i \varepsilon_{i1}(t) x_i(t)$, or the error of the linear model, and $\overline{P}_k = (\overline{P}_1[k], \ldots, \overline{P}_p[k])$ which is a vector of appliance's average active power consumption at period k.

A method for estimating consumption breakdown can be illustrated with the exemplary simple dataset shown in Table 1 above. The dataset comprises nine (9) samples from three binary sensors $x_1(t)$, $x_2(t)$ and $x_3(t)$, and their corresponding total measured power y(t) at a power meter located in the root node of a hierarchical tree representing an electrical network comprising three appliances. In certain scenarios, the power meter can be sampled at a higher rate (e.g., lower period) than the rate at which a power state (e.g., ON state or OFF state) changes. In one aspect, the power meter can provide a reading once a second (e.g., a 1 Hz rate) while power state of the rows in Table 1 can be expected to change after an interval that ranges from tens of seconds to several minutes. Thus, in certain embodiments, power measurements conveyed in the y(t) column in Table 1 is the running average of all power meter samples collected while the three binary sensors $x_1(t)$, $x_2(t)$ and $x_3(t)$ remain in the same state.

From data in exemplary Table 1, the various embodiments of the subject disclosure can estimate the average active power consumptions of the three appliances $\{\overline{P}_1, \overline{P}_2, \overline{P}_3\}$ over the total time period (e.g., T) where the samples were obtained by minimizing the mean square error (MSE) defined in Eq. (3). In one embodiment, analysis unit 130 can minimize the MSE defined in Eq. (3).

For practical purposes, the samples in Table 1 can be represented in a more compact format in which the samples with the same state (e.g., equivalent binary string in a row) can be compacted in a single row. For instance, row 1 in Table 1 can be combined with rows 2 and 8, row 4 can be combined with row 9, and so forth. Such compaction can result in a sample DT that has at most $2^p$ rows for all p appliances. In such compact format, samples are aggregated over the estimation period (e.g., T) and sample index t is replaced by k. The number of times a row occurs also can be tracked in a counter variable $n_k$. The variance of the running average in column y(t) for each row sample also can be recorded. Applying such more compact representation to Table 1 can result in a more compact table of 5 rows.

The structure of the sample table reveals two main properties that the various embodiments of the subject disclosure can exploit. First, samples that have fewer appliances in the ON state provide more information than samples with multiple appliances on, hence they should carry more weight in the estimation. Second, the variance of the meter readings running average in y(t) contains useful information about the stationarity of loads. This could also be exploited to give heavier consideration to stationary loads. Both cases suggest that the various embodiments of the subject disclosure should solve a weighted version of Eq. (3). In one aspect, to estimate consumption breakdowns, initially a weighted linear optimization problem can be solved and its solution provided in matrix form.

Using our samples from Table 1, we can formulate the weighted MSE function for our example as $$L(\overline{P}) = \sum_{k=1}^{5} w_k (\overline{y}_k - x_k(1)P_1 - x_k(2)P_2 - x_k(3)P_3)^2 \quad \text{Eq. (7)}$$

where $x_k(j)$ represents the jth bit indicative of a binary power state and $w_k$ represents a weight coefficient for the entire sample row $x_k$.

By taking partial derivatives of $L(\overline{P})$ and solving the resulting multivariate equations for $L(\overline{P})$ in Eq. (7), the following matrix equation of $\overline{P}$ can be obtained, $(X'WX)\overline{P} = X'W\overline{Y}$ where each matrix is defined by $$X = \begin{pmatrix} 0 & 0 & 1 \\ 0 & 1 & 1 \\ 1 & 0 & 0 \\ 1 & 0 & 1 \\ 1 & 1 & 1 \end{pmatrix}, W = \text{diag}\begin{pmatrix} w_1 \\ w_2 \\ w_3 \\ w_4 \\ w_5 \end{pmatrix}, \overline{Y} = \begin{pmatrix} 59.3 \\ 369.3 \\ 120.0 \\ 160.0 \\ 469.0 \end{pmatrix}$$

Based at least on the exemplary DT and the foregoing formalism, it is possible to generalize the solution of the exemplary DT to p binary sensors (or appliances) and n samples. In aspect, a dataset comprising data indicative of binary power states and data indicative of total power consumption can be assumed to be collected from p binary sensors and one power meter (e.g., power meter(s) 105, or $y_0$). If m distinctive $x_k$s are observed, a corresponding Weighted Mean Table can be defined as $TB = [W_{m \times 1} | X_{m \times p} | \overline{Y}_{m \times 1}]$. The estimate of P can be obtained by solving the following optimization problem with positive constraint as shown in Eq. (8).

$$\hat{P} = \underset{P \geq 0}{\text{argmin}} \|(X'WX)P - X'W\overline{Y}\| \quad \text{Eq. (8)}$$

where W is m×m diagonal matrix with ith diagonal elements defined hereinafter. In one aspect, by defining $\tilde{P} = (X'WX)^{-1}X'W\overline{Y}$, the optimal solution of Eq. (8) can be $\hat{P} = \tilde{P}$ when $\tilde{P} > 0$.

In addition to the general solution for an estimate for power consumption, which is expressed in terms of a weight matrix and collected data matrices, the subject disclosure provides a methodology to establish weights that can exploit binary power state diversity and observed consumption variance. Such methodology is referred to as weighting scheme. The subject disclosure also provides a performance metric that allows determining which data window to consider in order to account for non-stationarity of loads.

Weighting scheme that accounts for diversity.—A suitable weight (e.g., $w_k$) generally favors binary power states that have less appliances in the ON state and thus present less ambiguity. In such scenario, a weight can be provided that comprises the reciprocal of the total samples in an estimation period—e.g., number of 1s in each row in a compact format data table—namely, $$\frac{1}{\sum_i x_k(i)}.$$

In addition, a suitable weight can also generally favor binary power states that are observed more frequently and over longer time intervals. To at least such end, the subject disclosure can provide a weight $$w_k = \frac{n_k}{\sum_i x_k(i)},$$

e.g., the weight is defined as the quotient between a number of samples obtained for each binary power state and the total samples in an estimation period. It should be appreciated that improvements to the weighting scheme are possible by adjusting or modifying the weights $w_k$.

The foregoing weighting scheme can successfully capture the diversity of binary ON/OFF data, but it generally does not take into account non-uniformities in active power consumption of individual appliances (e.g., appliance(s) 120). It should be appreciated that in certain embodiments, a large dynamic range of active power consumptions can contribute more consumption breakdown estimation error than a noisy binary power state.

Figure 6:
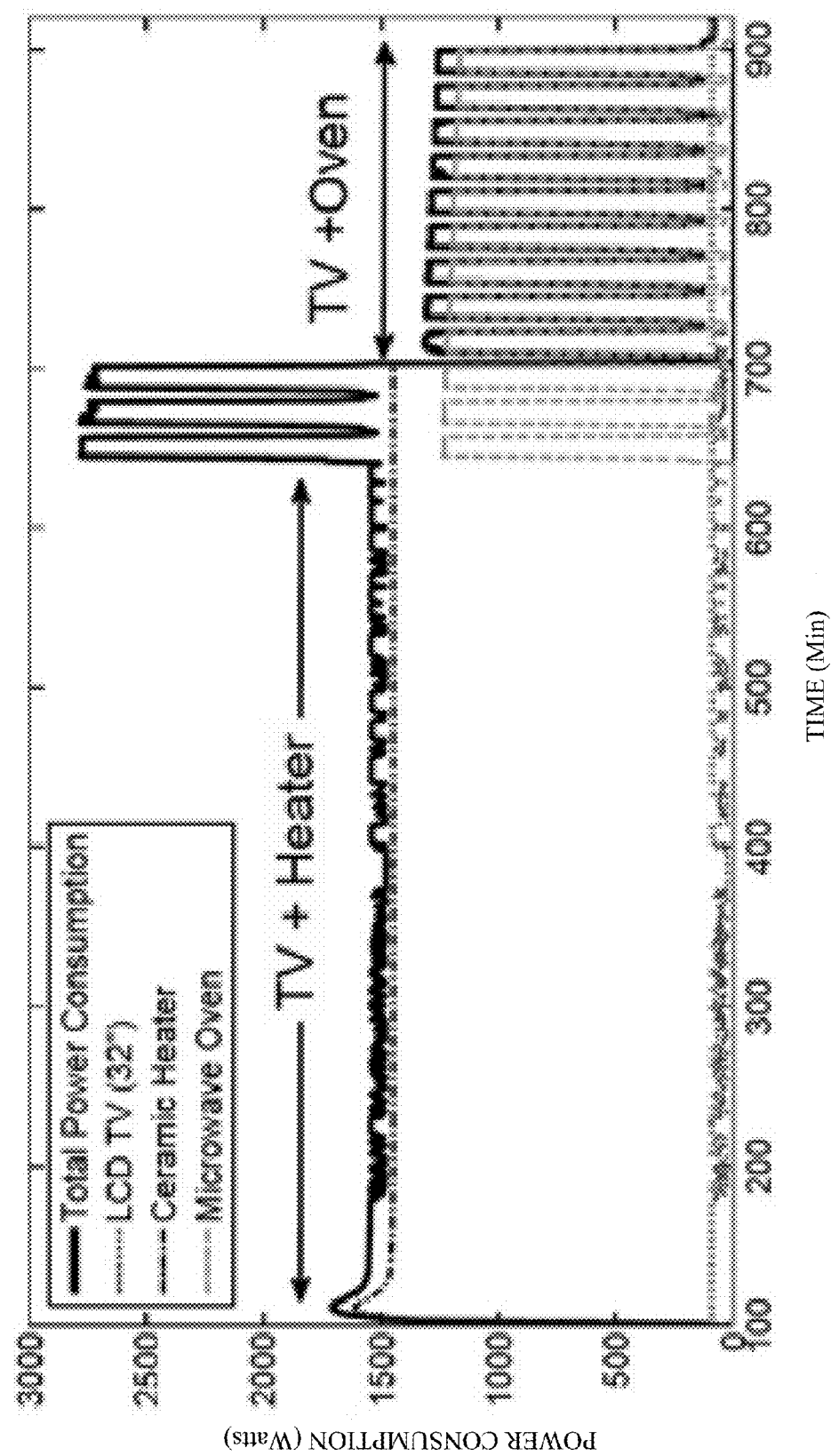
FIG. 6 illustrates non-uniform variance of active power consumption of exemplary appliances in accordance with aspects of the subject disclosure.

As an example, FIG. 6 presents power profiles of an LCD TV, a microwave oven, and a ceramic heater (or heater), and their total power consumption. The microwave oven presents a large dynamic range of active power consumption (e.g., from about 40 W to about 1200 W) during its ON state. At two composite power states of (TV+Heater) and (TV+Oven), their weight coefficients are equal given the same number of samples. However, it is more difficult to estimate average power consumption of the TV when both the TV and the microwave oven are ON than when the TV and the heater are ON because the total power consumption of the TV and microwave oven is significantly noisier than the other case. In order to reflect such an effect on estimation of power consumption, a weight coefficient can take into account the variance of active power consumption of each appliance.

Variance Sum Weight Matrix.—Let $\alpha_i^2$ denote the variance of active power consumption of the ith appliance. The weight coefficient $$w_k = \frac{n_k}{\sum_i x_k(i)},$$

can be extended to incorporate a weighted binary sum of the variances $\sum_i \alpha_i^2 x_k(i)$ rather than the unit binary sum $\sum_i x_k(i)$. A weight coefficient that includes the weighted binary sum of the variances can scale the influence of samples on the estimation of power consumption at each composite binary state according to active power consumption variances. In one aspect, a variance sum weight matrix is employed for the estimation of power consumption wherein weight coefficient of such weight matrix at a sample $x_k(i)$ can he defined in Eq. (9).

$$w_k = \frac{n_k}{\sum_{i=1}^{p} \alpha_i^2 x_k(i)}. \quad \text{Eq. (9)}$$

It is noted that in certain embodiments, $\alpha_i^2$ generally is not observable and thus it is estimated as we describe hereinafter.

Per Appliance Active Power Consumption Variance Estimation.—Exploiting the weight coefficient defined in Eq. (9) entails a priori knowledge of variances $\alpha_i^2$ for each appliance. Yet, such variances typically are unknown at the time of or before estimation of consumption (e.g., power consumption, energy consumption, or both) and can change dynamically over estimation periods. To address such lack of a prior knowledge and dynamic variation, the various embodiments of the subject disclosure can estimate the variances from a Weighted Mean Table described herein by utilizing a variance of total power consumption and variances of ON/OFF states of appliances in an electrical network. In one embodiment, analysis unit 130 can perform (e.g., execute) a method for estimating such variances in accordance with aspects described herein. From a Weighted Mean Table, the following equation can be derived.

$$\text{Var}(y_{ki}|x_k) = \frac{1}{n_k}\left(\sum_{i=1}^{p} \alpha_i^2 x_k(i) + \sum_{i\neq j}^{p} \text{Cov}(\overline{P}_i x_k(i), \overline{P}_j x_k(j))\right) \quad \text{Eq. (10)}$$

Where $y_{ki}$ is ith sample of y(t) at $x_k$ and Cov(r, s) is the co-variance of r and s.

The covariance sum, $\Sigma_{i,j}\text{Cov}(\cdot)$ generally is relatively smaller than the variance sum $\Sigma_i \alpha_i^2 x_k(i)$ when it is assumed that $x_k(i)$ and $x_k(j)$ are approximately independent. In one aspect, Eq. (10) conveys that $a_i$s can be estimated by formulating a convex optimization problem with the following two constraint conditions. (1) Degree of freedom: The minimum number of samples to compute variance of y(t) at $x_k$ is $n_k > \Sigma_i x_k(i)$. (2) Variance bounds: The standard deviation of the active power consumption of an appliance must be greater than 0 and less than its average active power consumption. In one aspect and a scenario in which the Weighted Mean Table of m samples, e.g., TB=[$W_{m\times 1}$|$X_{m\times p}$| $Y_{m\times 1}$] and M (a natural number) denotes a subset of rows $\{1, \ldots, m\}$ which satisfy the first constraint $n_k > \Sigma_i x_k(i)$, the variance of active power consumption can be estimated by solving the following optimization problem for $\alpha_1^2, \ldots, \alpha_p^2$:

$$\min_{\alpha_1^2 \ldots \alpha_p^2} \sum_{k \in M} \left(\frac{1}{\sum_i x_k(i)}\left(n_k \text{Var}(y_{ki}) - \sum_{i=1}^{p} \alpha_k^2 x_k(i)\right)\right)^2 \quad (11)$$

$$s. \text{ to } 0 \leq \alpha_i^2 \leq \overline{P}_i^2$$

For computing the upper bound of variance $\overline{P}_i^2$, estimates for the cumulative data set from a Weighted Mean Table that aggregates measurements over the entire measurement interval can be employed. It should be appreciated that the covariance term in Eq. (10) increases if more appliances are in the ON state; accordingly, to take such variation into consideration, a weight $$\frac{1}{\sum_i x_k(i)}$$

is assigned in Eq. (11).

Other source of variation observe in measured datasets indicative of power consumption is related to the stationarity properties of loads. For stationary loads, more data typically results in better estimates of consumption breakdown (e.g., power consumption breakdown, energy consumption breakdown, or both). Yet, for non-stationary loads, more data need not result in better estimates of consumption breakdown. In one aspect, the subject disclosure can account for such disparate response to available data by computing estimates over two alternative datasets and then applying an estimation quality metric to select a computed estimate of consumption breakdown with the least error. In certain embodiments, analysis unit 130 can compute such estimates and apply the estimation quality metric. In another aspect, the two datasets can be retained in two alternative versions (or instances) of the Weighted Mean Table (WMT); such versions can be retained in a memory that is part of analysis unit 130 or that is functionally coupled thereto. In one aspect, a first version of the WMT can comprise an entire dataset over an entire collection time and estimates of consumption breakdown computed from such WMT are referred to as cumulative power estimates or $\overline{P}_{cma}$. In another aspect, a second version of the WMT can comprise data from measurements collected over a current estimation period and estimates of consumption breakdown computed from such data are referred to as $\overline{P}_{cur}$.

TABLE 2

Weighted Mean Value Table constructed from, (a) the data set of the 3rd estimation period, t = {7, 8, 9}, and (b) the entire data set of t = {1, . . . , 9} in Table 1

| k | $w_k = \dfrac{n_k}{\sum_i x_k(i)}$ | $x_k(1)$ | $x_k(2)$ | $x_k(3)$ | $\overline{y}_k$ | $n_k$ |
|---|---|---|---|---|---|---|
| 1 | 1/3 | 1 | 1 | 1 | 469 | 1 |
| 2 | 1/2 | 0 | 1 | 1 | 357 | 1 |
| 3 | 1/1 | 0 | 0 | 1 | 56 | 1 |
| (a) | | | | | | |

| k | $w_k = \dfrac{n_k}{\sum_i x_k(i)}$ | $x_k(1)$ | $x_k(2)$ | $x_k(3)$ | $\overline{y}_k$ | $n_k$ |
|---|---|---|---|---|---|---|
| 1 | 3/1 | 0 | 0 | 1 | 59.3 | 3 |
| 2 | 3/2 | 0 | 1 | 1 | 369.3 | 3 |
| 3 | 1/1 | 1 | 0 | 0 | 120 | 1 |
| 4 | 1/2 | 1 | 0 | 1 | 160 | 1 |
| 5 | 1/3 | 1 | 1 | 1 | 469 | 1 |
| (b) | | | | | | |

Adaptive Data Selection.—As an example, DT in Table 1 is considered assuming an estimation period, $T_{est}=3T_s$, which spans three sampling period for power measurements. At the third estimation period $t_m=\{7T_s, 8T_s, 9T_s\}$ the weighted mean table can be constructed either from the partial data set observed from the current period as shown in the Table 2(a) or the cumulative data set of $t_{cum} = \{T_s, \ldots, 9T_s\}$ as conveyed in Table 2(a). By solving optimization problem given the Weighted Mean Table of the cumulative dataset, analysis unit 130 can generate estimates for power consumption of the three appliances, the power consumption estimates being $\overline{P}_3 = 57.70$, $\overline{P}_2 = 309.38$ and $\overline{P}_1 = 111.88$, which denoted by $\widetilde{P}_{cma} = [111.88, 309.30, 57.70]$. For the data in Table 2(a), the binary matrix X becomes a triangular matrix. Therefore, average power consumption breakdown can be computed without ambiguity, wherein the average power consumption breakdown is $\overline{P}_3 = 56$, $\overline{P}_2 = 357 - 56 = 301$, and $\overline{P}_1 = 469 - 357 = 112$. Accordingly, $\widetilde{P}_{cur} = [112, 301, 56]$.

In one aspect, $\widetilde{P}_{cur}$ estimates can be less ambiguous and, can also be less accurate than estimates $\widetilde{P}_{cma}$ because $\widetilde{P}_{cur}$ estimates are computed through a single sample at each estimation period in Table 2(b). Therefore, for each appliance, the best estimate of consumption breakdown can be obtained by selecting the more reliable estimate among the two estimates $\widetilde{P}_{cma}$ and $\widetilde{P}_{cur}$ for each appliance—in one aspect, analysis unit 130 can carry out such selection. As an illustration, if the second appliance in the set of three appliances has stationary active power consumption and the remaining two appliances have non-stationary active power consumption, then the best estimates can arise from selecting the estimate of $\overline{P}_2$ from $\widetilde{P}_{cma}$ and the remaining estimates from $\widetilde{P}_{cur}$. Accordingly, optimal estimates can be $\widetilde{P}_{opt} = [112, 309.30, 56]$.

As illustrated in the foregoing exemplary scenario, the various embodiments of the subject disclosure can determine (e.g., compute) two estimates of active average power consumption breakdowns; namely, $\widetilde{P}_{cma}$ from an entire dataset and $\widetilde{P}_{cur}$ from a partial dataset. In addition, such embodiments can select the most suitable estimate (e.g., the best estimate) between the two estimates for each appliance in an electrical network. In one embodiment, analysis unit 130 can determine such estimates of power consumption breakdown, and can select the most suitable of the estimates. In one aspect, criteria to select an estimate of power consumption breakdown can comprise prediction (e.g., through computation) of values of Mean Square Errors for each appliance for each estimate, e.g., $\widetilde{P}_{cma}$ and $\widetilde{P}_{cur}$, and a comparison of such MSEs with predetermined threshold values. Estimation Accuracy Prediction.—In certain embodiments, Mean Square Error can be predicted by considering the variance of an estimate of average power consumption $\overline{P}$. In one aspect, such variance satisfies the following equality:

$$\text{Var}(\overline{P}) = [(\overline{P} - E(\overline{P}))^2] = E[(\overline{P} - \overline{P})^2],$$

where the second equality comes from $E(\overline{P}) = \overline{P}$ for unbiased errors, e.g., $E(e) = 0$.

The variance of a coefficient estimate is proportional to $(X'WX)^{-1}$ where X is a binary data matrix from binary sensors and W is a weight matrix, which can be designed for satisfactory estimation according at least in part to aspects described herein. Therefore, the MSE of average active power consumption of ith appliance MSE $(\overline{P}_i)$ can be obtained by computing a ith diagonal element of $\text{Var}(\overline{P})$ as shown in Eq. (12).

$$\text{MSE}(\overline{P}_i) = \sigma_T^2 [(X'WX)^{-1}]_{ii} \qquad \text{Eq. (12)}$$

where $\sigma_T^2$ is a variance of the total power consumption y(t), e.g., $\sigma_T^2 = \text{Var}(e(t))$ where e(t) is defined in Eq. (6). In one aspect, an estimate of $\sigma_T^2$ can be determined by $$\hat{\sigma}_T^2 = \frac{\sum_{t=1}^{n}(y(t) - \hat{P}_k x(t))^2}{n - (p+1)}, \qquad \text{Eq. (13)}$$

which is the residual sum of squares of y(t) divided by its degree of freedom, n−(p+1) where n is the number of samples and p is the number of appliances.

FIG. 7 illustrates an exemplary method 700 for estimating energy breakdown estimation in an electrical network through binary power state sensing and for a single power meter in accordance with aspects of the subject disclosure. At every instant t ($T_s = 1$ s) a sample of total power consumption y(t) from the power meter is collected, and a Weighted Mean Table TB is updated according to a current binary state x(t) (step 3 in exemplary method 700 in FIG. 7). The kth row of the WMT TB can retain a queue $Q_k$ which contains the sample y(t) for $x(t) = x_k$ and a pointer, $ptr_k$, which indicates the first sample of a current estimation period $T_{est}$.

If the current time t is the end of the current estimation period, then the algorithm computes the energy breakdown is computed (step 4 in exemplary method 700). In one embodiment, analysis unit 130 a component therein can compute such energy breakdown. From the WMT TB, a variance of the active power consumption $\alpha^2$ can be estimated. Optionally, in one or more embodiments, analysis unit 130 or a component therein can estimate $\alpha^2$. The average active power consumption can be computed for a cumulative data set $\widetilde{P}_{cma}$ and a current data set $\widetilde{P}_{cur}$, and optimal estimates $\widetilde{P}_{opt}$ for a set of one or more appliances in the electrical network can be selected based at least on an estimation performance metric, such as the one defined in Eq. (12) (steps 8-12 in example method 700). For the ith appliance in the set of one or more appliances, an energy consumption $\hat{E}(i)$ of the ith appliance can be computed by multiplying $\widetilde{P}_{opt}(i)$ by the ON state duration, or time period, during the estimation period $T_{est}$ (step 13 in example method 700). The pointer $ptr_k$ can be reset for a next estimation period (step 15 in example method 700).

As described herein, the subject disclosure also provides a method for deploying additional power meters. In one aspect, the exemplary method includes two stages. In a first stage, power consumptions are estimated in accordance with exemplary method 700, and data statistic is learned as described herein. In a second stage, to improve estimation accuracy, a satisfactory (optimal, nearly optimal, planned, etc.) number of additional power meters and their respective locations are determined. In one embodiment, analysis component 130 or a component therein can determine such number and related locations. In one aspect, to at least such end, a cost function can define or be configured to quantify at least two conflicting goals: (1) a number of power meters which generally is desired to be kept low, and (2) an estimation accuracy which generally is desired to be high.

Figure 8:
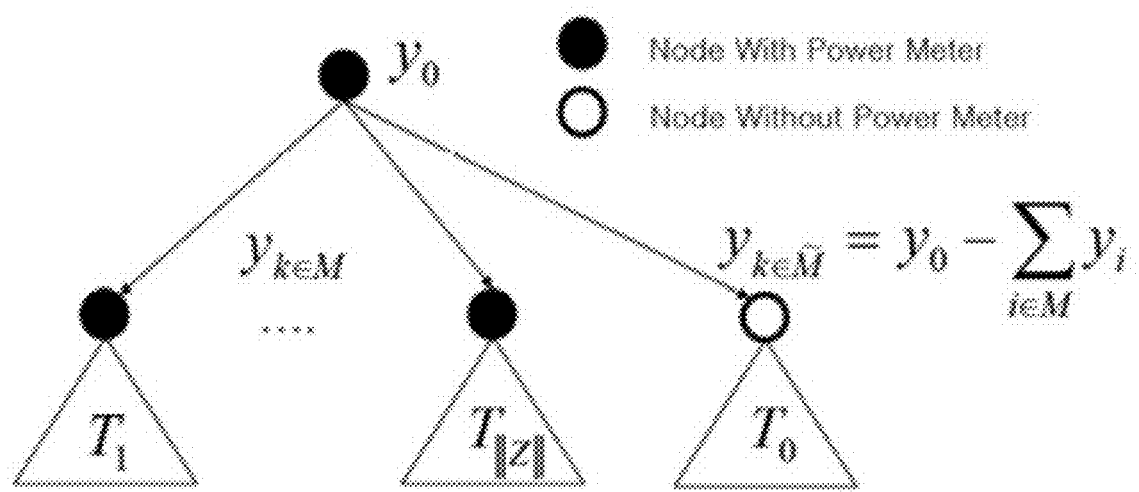
FIG. 8 illustrates a tree representation of an electrical network and related power meter deployment in accordance with aspects of the subject disclosure.

In one aspect, power meter deployment can be treated as a tree decomposition problem related to finding a solution to decompose an ambiguous data matrix X of binary states into a plurality of apparent subsets of column vectors (or subtrees). FIG. 8 illustrates a hierarchical tree representation wherein one or more power meters can be deployed on electrical outlets, including one power meter on the root node. In certain embodiments, two or more electrical outlets can be partitioned into two groups with and without a power meter, denoted by M and $\widetilde{M}$, respectively. In a scenario in which q (a natural number) electrical outlets are available in an electrical network, a binary q tuple $Z=(z_1, Z_2 \ldots z_q)$, with $z_i \in [0,1]$, can define a state of power meter placement, wherein $z_i=1$ when a power meter is located at the ith electrical outlet, and $z_i=0$ otherwise. As an illustration, $Z=(0,0, \ldots 0)$ for a single power meter on the root node of the hierarchical tree.

Let $T_i$ denote a sub-tree of appliances at ith power meter, $i \in \{0,1, \ldots \|Z\|\}$. All appliances plugged into electrical outlets without a power meter can be grouped into a subset $T_0$. As described herein, the method for deploying additional power meters includes decomposing the data matrix X based at least on assessing at least two conflicting objectives: the number of power meters $\|Z\|$ and the estimation accuracy $$\left\{ \sum_{i=0}^{\|Z\|} MSE(\overline{P}|\mathcal{T}_i) \right\}.$$

A common approach to optimize conflicting goals is to define or design a cost function and minimize it. In the subject disclosure, such minimization can include predicting the estimation accuracy at each sub-tree, e.g., $MSE(\overline{P}|T_i)$, and computing a satisfactory (optimal, nearly-optimal, planned, etc.) number of power meters and their locations while avoiding a combinatorial instability (or "explosion") of a search space.

In one aspect, the metric $MSE(\overline{P})$ in Eq. (12) can provide a good prediction for the estimation accuracy at each sub-tree. Such a metric can rely on two statistics to predict estimation performance: an expected number of samples at each binary state, and the variance of active power consumption of appliances. In order to avoid the combinatorial instability of the search space, the various embodiments of the subject disclosure can compute an approximate solution instead of the exact solution by using a stochastic optimization technique, for example, simulated annealing, genetic algorithm, Monte Carlo simulations, or the like.

In embodiments that exploit simulated annealing, a Markov random field on $\mathcal{Z}$ can be defined. It should be appreciated that a Markov random field is a graphical model where the dependence among the random variables can be determined by the edges of a graph through a generalization of the Markov property. In the subject disclosure, a state vector Z can be represented as vertices of a Markov random field, and state transition between two or more vertices occurs according to a Markovian process. In one aspect, two state nodes $s \in \mathcal{Z}$ and $t \in \mathcal{Z}$ are said to be neighbors if and only if $d_1(s,t)$, a 1-norm distance between s and t, is one—for a point $(r_1, r_2, \ldots, r_n)$ and a point $(v_1, v_2, \ldots, v_n)$, the g-norm distance is defined as $$d_g(r, v) = \left( \sum_{i=1}^{n} |r_i - v_i|^g \right)^{\frac{1}{g}},$$

with g a natural number. In one aspect, nb(t) denotes the set of neighbors of t, that is, $nb(t)=\{s \in \mathcal{Z} | d_1(s,t)=1\}$. A goal of simulated annealing is to find an $l \in \mathcal{Z}$ minimizing $c(l)$, where $c(\cdot)$ is a specific cost function defined on a non-empty set of state nodes Z of a graph. As described herein, the cost function is defined or designed to quantify the tradeoff between a predicted estimation accuracy, $MSE(\overline{P})$, and the number of power meters, $\|Z\|$ given a state node, $Z \in \mathcal{Z}$. Both estimation accuracy, or quality, and the number of meters can be evaluated against an initial solution, denoted by $Z_0$ which corresponds to placing power meters at all the available electrical outlets.

In certain embodiments, the cost function is defined as conveyed in Eq. (14) where $\lambda \in [0,1]$ is a weight coefficient and $\lambda=0.5$ as a default value.

$$c(Z) = \lambda \left\{ -\underbrace{\frac{MSE(\overline{P}|Z_0)}{MSE(\overline{P}|Z)}}_{estimaion\ quality} \right\} + (1-\lambda) \underbrace{\left\{ \frac{\|Z\|}{\|Z_0\|} \right\}}_{mode\ efficiency} \quad \text{Eq. (14)}$$

In the cost function in Eq. (14), the coefficient, $\lambda$ quantifies a weight afforded to estimation quality with respect to the weight $(1-\lambda)$ afforded to the number of power meters. Accordingly, it should be appreciated that the initial solution $Z_0$ has the best estimation quality (e.g., or minimum MSE($\overline{P}$)) but the worst node efficiency (or maximum $\|Z\|$). In Eq. (14), the first term quantifies the estimation improvement over the initial solution $Z_0$; the value of the first term ranges from −1 to 0. Similarly, yet not identically, the second term in Eq. (14) quantifies node efficiency improvement over the initial solution $Z_0$; the value of the second term ranges from 0 to 1. Therefore, the cost function defined by Eq. (14) is set to 0 for initial solution.

Subsequently, a functional element (e.g., analysis unit 130) that implements (e.g., executes) the simulated annealing can evaluate the cost function over neighbors and make a transition according to a transition probability matrix. In one or more embodiments, the functional element can run a Markov chain $\mathcal{Z}$ according to the probability transition matrix $A_T$ defined by Eq. (15).

$$A_T(i, j) = \begin{cases} \frac{1}{d(i)} \left\{ \min\left(1, \frac{e^{-c(j)/T}}{e^{-c(i)/T}}\right) \right\} & \text{if } j \in nb(i) \\ 1 - \sum_{j \in nb(i)} A_T(i, j) & \text{if } j = i \\ 0 & \text{if } j \notin nb(i), j \neq i \end{cases} \quad \text{Eq. (15)}$$

where d(i) is the number of neighbors of a state node i and T>0 represents temperature.

For each iteration step $\tau$, the simulation temperature T exponentially decreases according to a cooling schedule $T(\tau)=T_0 \alpha^\tau$ where $0<\alpha<1$ and $T_0$ is a initial temperature. Simulation iterations are stopped when the temperature becomes less than an equilibrium temperature $T_e$. It is noted that simulated annealing generally is a slow algorithm for minimization of the cost function defined in accordance with aspects of the subject disclosure, but typically is executed once during the deployment power meters in an electrical network. It should be appreciated that other more efficient methods also can be applied for minimization of the cost function described herein; such other method are thus contemplated in the subject disclosure.

In one implementation, the formalism provided in the subject disclosure is validated by collecting ground truth power consumption data from 12 appliances in a one-bedroom apartment for three days (e.g., from Thursday to Saturday) using a commercial power meter (Watts up.Net). In such implementation, data collected through various measurements including total consumption and binary state transitions enables construction of two exemplary case studies that allow evaluation of the accuracy of the various methods of the subject disclosure. The various optimization problems associated with the formalism set forth in the subject disclosure can be solved with a variety of software applications that afford numerical solutions; for instance, the fmincon function of the optimization toolbox of MATLAB®, from MathWorks® of Natick, Mass., can be utilized. Details of each of the two exemplary case studies are provided below.

Figure 9:
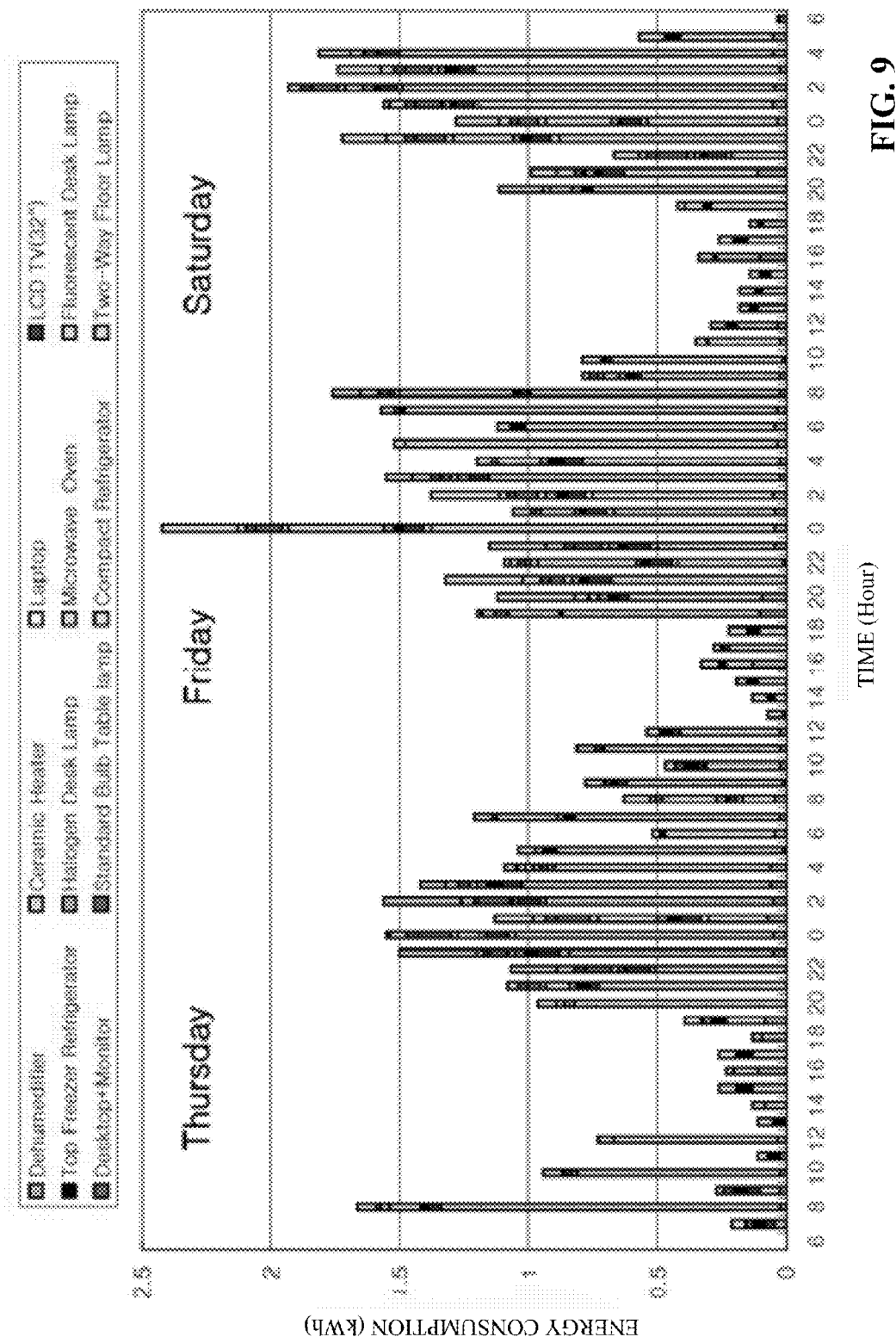
FIG. 9 displays hourly energy consumption ground truth in a one-bedroom apartment based on data collection spanning a portion of a week in accordance with aspects of the subject disclosure.

Exemplary Case Study 1: A small electrical network with a single power meter.—In the subject exemplary case study, energy breakdown performance is evaluated using a collected power measurement dataset for 12 appliances operating in a one bedroom apartment. Actual power consumption of each appliance is collected by a power meter with 1 Hz sampling rate, and data indicative of binary power state (ON state or OFF state) of each appliance is obtained by simple thresholding implemented in a power state sensor embedded or otherwise functionally coupled to the appliance. Hourly energy consumption profiles of the 12 appliances are displayed as a stacked bar graph in FIG. 9. During measurements, guests of the one-bedroom apartment frequently visit and stay in the apartment and are involved in various activities such as cooking, watching TV, playing games, and so forth. A ceramic heater (located in the bedroom, in certain scenarios) is pre-programmed to maintain the temperature to 75° F. throughout the day.

To understand energy load characteristics, daily energy consumption profiles of appliances are summarized in Table 3. In one aspect, data in Table 3 displays a large variation of energy load among the probed appliances. As described herein, such variation can be addressed by the several embodiments of the subject disclosure. In one aspect, the ceramic heater accounts for more than 60% of the total energy consumption due to low temperature outside the one-bedroom apartment during data collection, $(20\pm10)°$ F. In another aspect, the laptop computer (or laptop) consumed the least less than 1% of the total load.

Figure 10:
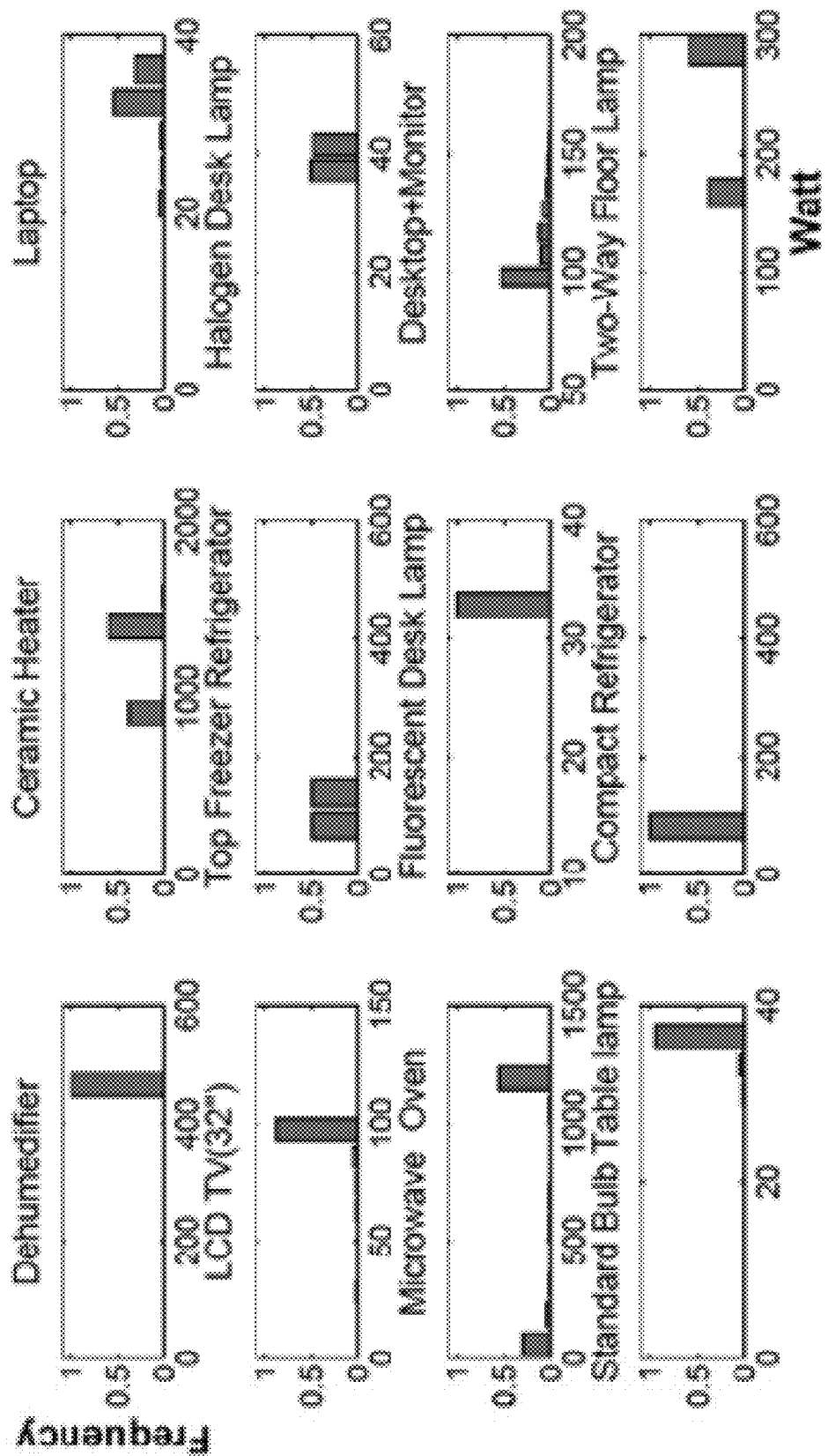
FIG. 10 illustrates histograms of power consumption for an exemplary set of appliances during their ON power state in accordance with aspects of the subject disclosure.

The collected data also exhibits the non-stationary property of active power consumptions. FIG. 10 presents normalized histograms of power consumptions of the probed appliances when respective binary sensors detect the ON state. In particular, yet not exclusively, FIG. 10 displays results for the ceramic heater, the microwave oven, and the two-way floor lamp. Such devices display two distinctive power modes while they are in the ON state. The computers, e.g., desktop combined with monitor and laptop, exhibit more mono-modal power consumption modes. The desktop combined with the monitor and the laptop have Idle modes at 100 Watt and 200 Watt, respectively.

In one aspect, the total number of observed distinctive composite binary states is 336, which accounts for 8% (obtained from the ratio $336/2^{12}$) of the maximum number of possible binary states. Occurrence of binary states has a highly non-uniform distribution. In one aspect, the most frequently observed binary state is the ON state of the compact refrigerator. Such binary state commonly occurs when the compact refrigerator is operating. In addition, such binary state can account for 15.7% of the power-state change events among the total number of samples 25920 (which is results from 24 hs×60 min×60 s×3 days). In another aspect, the next most frequently observed states are those that occur (a) when all appliances are OFF, such binary states account for about 7.1% of all collected samples; (b) when the compact refrigerator and the ceramic heater are ON, such states account for about 6.9% of all collected samples; (c) when the top freezer refrigerator and the ceramic heater are ON; and (d) when only ceramic heater is ON, such binary states account for about 6.9% of all collected samples.

In another aspect, estimation performance of the methods described herein is assessed for hourly energy consumption breakdown estimates. Its ground truth is displayed in FIG. 11. Relative error in percentage can be utilized as a performance metric. The relative error is defined by the ratio of the difference between actual and estimated energy consumptions to the actual energy consumption:

$$\text{relative error} = 100 \times \frac{|\text{actual energy consumption} - \text{estimated energy consumption}|}{\text{actual energy consumption}}$$

In certain embodiments, the metric can be prone to large rounding error for vampire power and thus computations may be inaccurate. Accordingly, the metric is evaluated when an appliance is ON while excluding OFF events from the performance evaluation.

Figure 11:
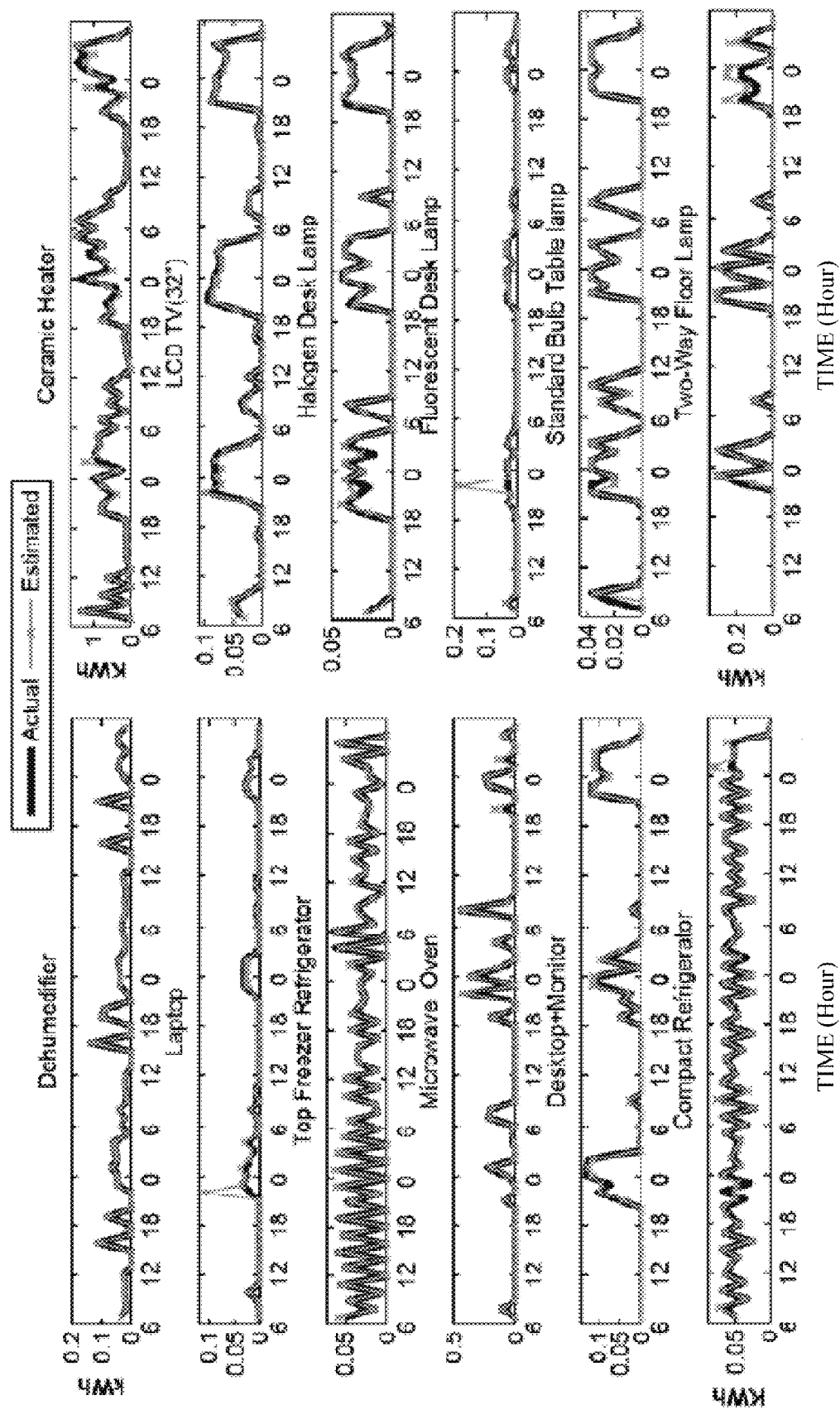
FIG. 11 presents exemplary profiles of estimated hourly energy consumption of each appliance in the exemplary set of appliances in FIG. 9 and for the portion of the week in accordance with aspects of the subject disclosure.

Estimated hourly energy consumption profiles are displayed in FIG. 11 as a thin dotted line with a cross mark, which compared to the actual profiles shown as a thick solid line. As shown in FIG. 11, the estimated energy consumption profiles (labeled "Estimated") substantially match the actual energy consumption profiles (labeled "Actual"). It is noted that there is a large estimation error for the laptop and the fluorescent desk lamp at 22:00 hs (or 10:00 PM) on Thursday, which is one of the specific days in which the appliances are probed. Without wishing to be bound by theory or modeling, it is believed that this is because active power consumptions are estimated with little cumulative data of those appliances upon estimation at 22:00 hrs, which results

TABLE 3.

Daily energy consumption breakdown of appliances in kWh and percentage values.

| Usage (kWh) | Dhm.-dfr. | Heater | Laptop | LCD TV | Top. Frg. | Hlg. Lmp. | Mcr. Oven | Fls. Lmp. | Desttop. | Blb. Lmp. | Cmt. Frg. | Flr.2W Lmp. | Total kWh |
|---|---|---|---|---|---|---|---|---|---|---|---|---|---|
| Thur. | 0.72 | 11.54 | 0.20 | 0.72 | 0.67 | 0.34 | 0.57 | 0.30 | 0.61 | 0.30 | 1.24 | 1.03 | 18.28 |
| Fri. | 0.74 | 13.31 | 0.19 | 0.84 | 0.71 | 0.36 | 1.68 | 0.26 | 0.48 | 0.33 | 1.24 | 1.62 | 21.80 |
| Sat. | 0.59 | 13.48 | 0.14 | 0.71 | 0.61 | 0.32 | 1.22 | 0.20 | 0.68 | 0.34 | 1.14 | 1.16 | 20.63 |
| Average | 0.68 | 12.78 | 0.17 | 0.75 | 0.67 | 0.34 | 1.16 | 0.25 | 0.59 | 0.33 | 1.21 | 1.27 | 20.24 |
| Percent | 3.4% | 63.1% | 0.8% | 3.7% | 3.3% | 1.7% | 5.7% | 1.3% | 2.9% | 1.6% | 5.9% | 6.3% | 100% | in a large variance of estimates. In one embodiment, analysis unit 130 can perform (e.g., compute) the power consumption estimates. In one aspect, results presented in FIG. 11 convey that no such large errors are observed after sufficient cumulative data is collected.

TABLE 4

Number of optimal data sets and data selection error rate during the hourly energy consumption breakdown estimation.

|  |  | actual optimal selection | |
|---|---|---|---|
|  |  | current | cumulative |
| predicted optimal selection | current | 520 | 42 |
|  | cumulative | 130 | 172 |
| total observed |  | 650 | 214 |
| error rate |  | 20.00% | 19.62% |

Figure 12:
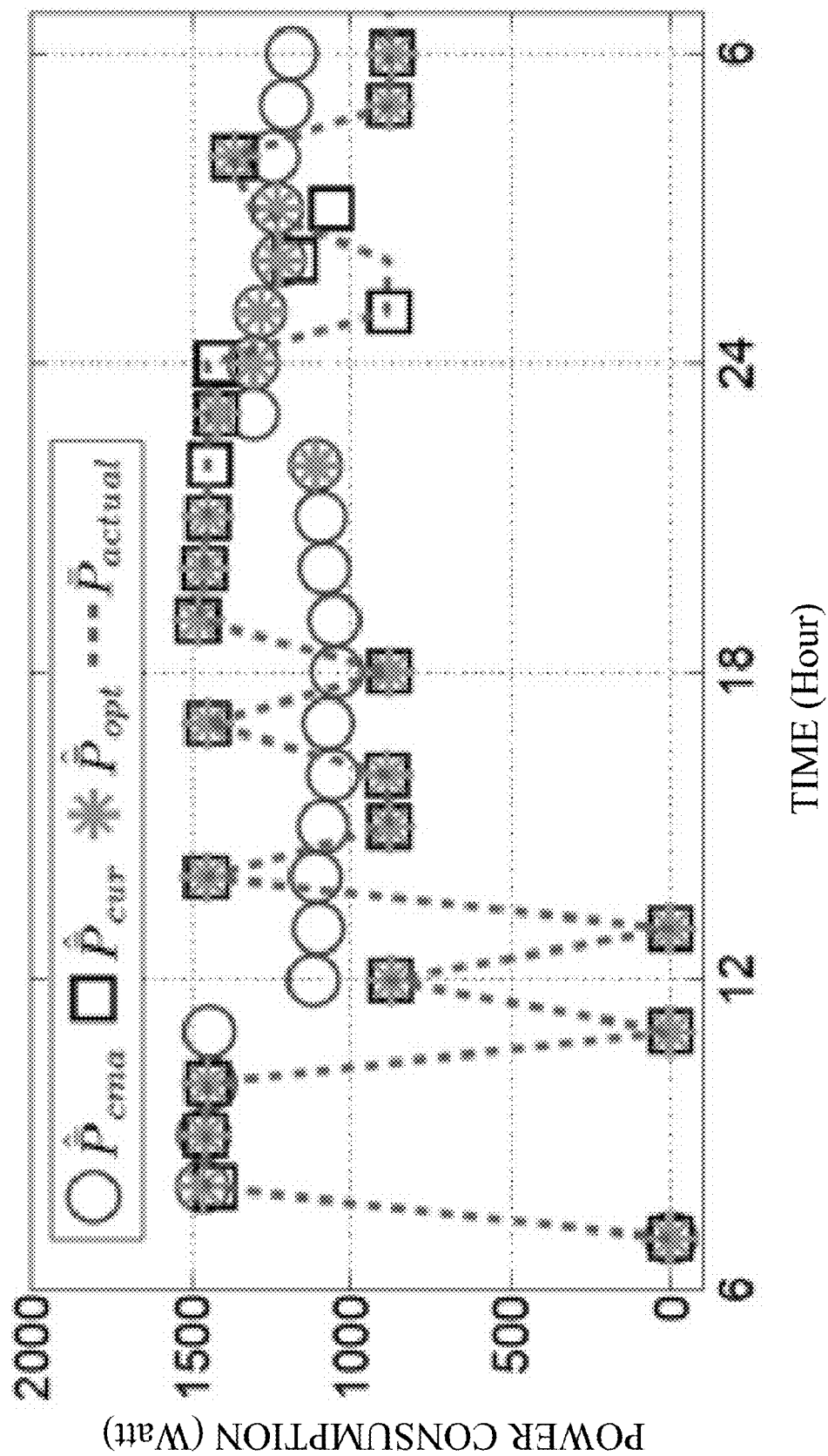
FIG. 12 illustrates optimal data selection for estimating power breakdown of an exemplary device (e.g., a ceramic heater) in accordance with aspects of the subject disclosure.

FIG. 12 illustrates data selection (e.g., optimal data selection) for estimating power breakdown of an exemplary device (e.g., a ceramic heater) in accordance with aspects of the subject disclosure. The data selection can be part of a method for estimating power consumption for the ceramic heater, embodying the exemplary device, and during the first day of data collection. Various approaches to data selection and estimation of the power consumption of the ceramic heater are illustrated in FIG. 12. Average active power consumption is estimated using the entire cumulative dataset, which yields $\tilde{P}_{cma}$ (represented by open circle symbols in the drawing), and a dataset during a current estimation period, which yields $\tilde{P}_{cur}$ (represented by by open square symbols). As described supra, a better (e.g., optimal) estimate $\tilde{P}_{opt}(i)$ (represented by star symbols) is selected. For comparison, FIG. 12 presents the actual average active power consumption as a dotted line. It can be appreciated that $\tilde{P}_{cur}$ is closer to the actual average power consumption than $\tilde{P}_{cma}$, which can be expected for non-stationary active power consumptions. From such results it becomes apparent that implementation of the methods of the subject disclosure, when implemented, generally select a suitable estimate of power consumption.

Table 4 presents prediction performance of the optimal data selection for the hourly energy breakdown estimation in accordance with aspects of the subject disclosure. The total number of prediction trials is 864 (computed from 3 days×24 hs×12 appliances). In one aspect, cumulative data and current data are optimal for about 75% (650/864) and about 25% (214/864) of the total estimates, respectively. The prediction error is about 20% for both data selection scenarios.

can be analyzed. In one aspect, to evaluate the impact of weight matrix on performance, the following 4 different types of weight matrix are utilized. (a) No Weight: $w_k=n_k$, (b) Unit Sum Matrix: $w_k=1\Sigma_i x_k(i)$, (c) Estimated Variance Sum Matrix: $w_k=n_k/\Sigma_i \hat{\alpha}_i^2 x_k(i)$, and (d) Exact Variance Sum Matrix: $w_k=n_k/\Sigma_i \alpha_i^2 x_k(i)$.

In another aspect, for comparison purposes and in addition to the foregoing proposed weight matrices ((a) through (d)), the Estimated Variance Sum Matrix we run our algorithm with the known exact variance, $\alpha^2$, (Exact Sum Variance Matrix) which generally provides the best performance. The effect of utilizing a poor weight matrix scheme is shown in Unit Sum Matrix. In weight scheme (b), diversity of binary sensor data is neglected by assigning an equal weight (e.g., 1) to all binary samples except for normalizing by the number of observed samples $n_k$.

Estimation performance for the following 4 different data selection schemes also is compared: (A) Cumulative dataset, (B) Current dataset, (C) Predicted optimal dataset, and (D) Actual (or predicted by an idealized oracle unit) optimal dataset.

In one aspect, the estimation performance of the proposed data selection scheme (e.g., predicted optimal data set) can be compared to the estimation performance attained when using the entire cumulative dataset exclusively and when using the current estimation period dataset exclusively. In another aspect, the estimation performance can be evaluated in a scenario in which a perfect predictor is used (e.g., an idealized oracle unit that can supply an indication of which dataset to select). In one aspect, the preferable achievable performance, or the lower bound of estimation error, can be attained when the optimal data set (e.g., Oracle Data Selection) with exact variance of active power consumption of each appliance (Exact Variance Sum Weight) is selected. Such lower bound can be compared to various implementations of data selection in order to assess potential improvement in the performance of the various methods described herein.

TABLE 5

Average relative error of hourly energy consumption estimates for each day.

| Error (%) | Dhm.-dfr. | Heater | Laptop | LCD TV | Top. Frg. | Hlg. Lmp. | Mcr. Oven | Fls. Lmp. | Desttop. | Blb. Lmp. | Cmt. Frg. | Flr.2W Lmp. | Avg. |
|---|---|---|---|---|---|---|---|---|---|---|---|---|---|
| Thur. | 0.98 | 6.15 | 60.99 | 7.74 | 6.41 | 17.35 | 18.14 | 46.18 | 8.83 | 13.63 | 8.28 | 8.25 | 16.91 |
| Fri. | 1.05 | 5.77 | 10.86 | 4.48 | 3.59 | 4.04 | 5.31 | 14.53 | 9.96 | 7.23 | 5.01 | 2.94 | 6.23 |
| Sat. | 0.78 | 6.30 | 9.92 | 3.58 | 4.81 | 4.53 | 33.45 | 8.03 | 8.32 | 1.52 | 4.07 | 30.71 | 9.67 |
| Avg. | 0.94 | 6.07 | 27.25 | 5.27 | 4.94 | 8.64 | 18.97 | 22.91 | 9.04 | 7.46 | 5.79 | 13.97 | 10.94 |

Table 5 summarizes results for the average relative error of hourly energy consumption estimate per appliance for each day in accordance with aspects of the subject disclosure. In one aspect, a relatively large error is obtained in the first day of data collection, but the error and related estimation performance is significantly improved in the second and third days of data collection. In another aspect, overall average relative error of algorithm is 10.94%.

Performance changes over different estimation periods (e.g., $T_{est}$), weight matrix (W), data selections ($\tilde{P}_{cma}$ or $\tilde{P}_{cur}$)

TABLE 6

Average relative error of active power consumption for all estimation periods.

| relative error (%) | no weight | unit.var weight | est.var weight | exact.var weight |
|---|---|---|---|---|
| cma.data | 66.19 | 62.43 | 17.51 | 8.16 |
| cur.data | 52.77 | 52.38 | 47.00 | 42.39 |

TABLE 6-continued

Average relative error of active power consumption for all estimation periods.

| relative error (%) | no weight | unit.var weight | est.var weight | exact.var weight |
|---|---|---|---|---|
| opt.data | 42.91 | 40.80 | 9.48 | 5.91 |
| oracle.data | 23.07 | 21.34 | 5.50 | 3.32 |

Figure 13A:
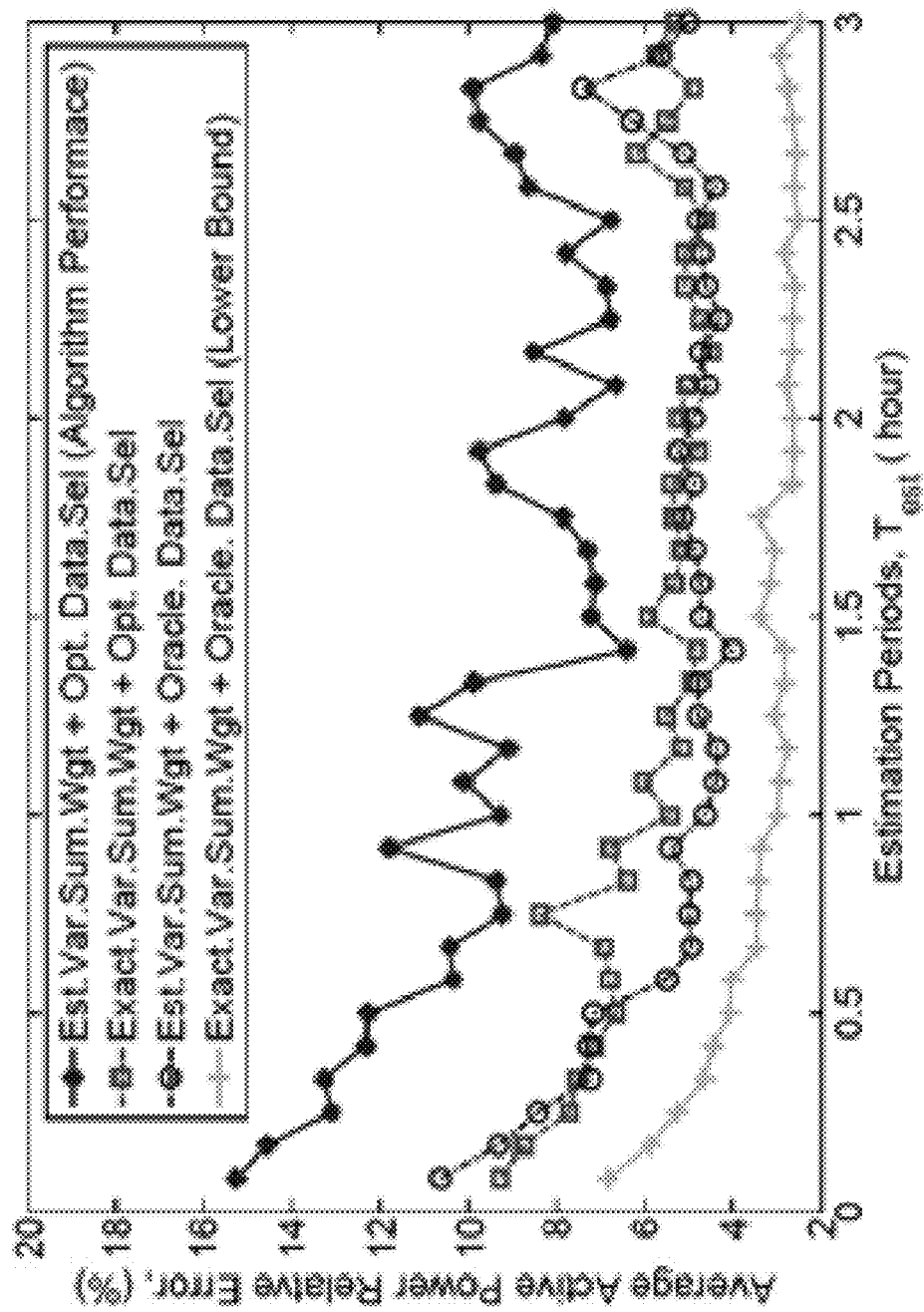
FIGS. 13A-13C presents average relative error of active power consumption over various estimation periods and based on disparate protocols for weighting power state data and schemes for data selection in accordance with aspects of the subject disclosure.
Figure 13B:
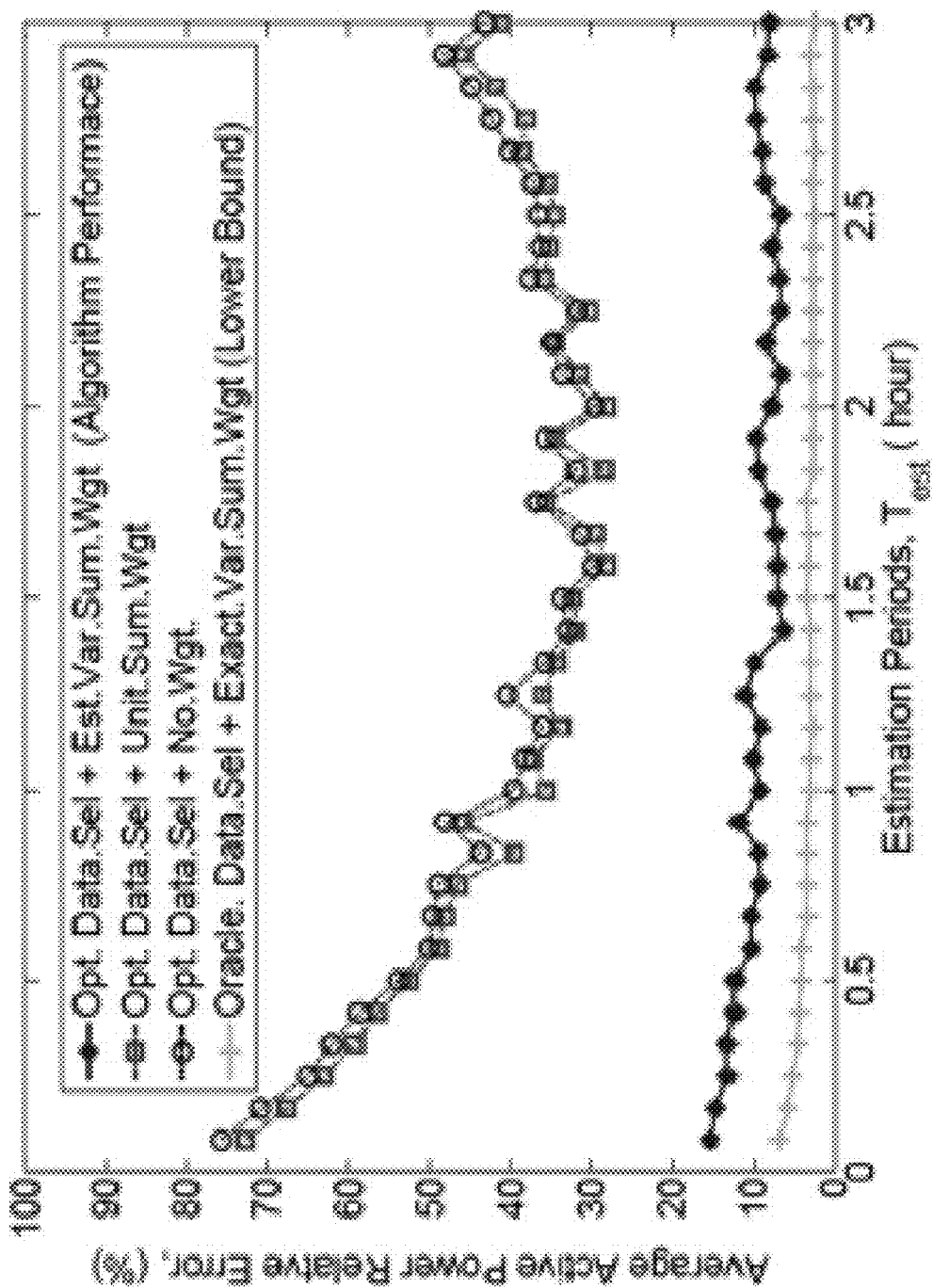
Figure 13C:
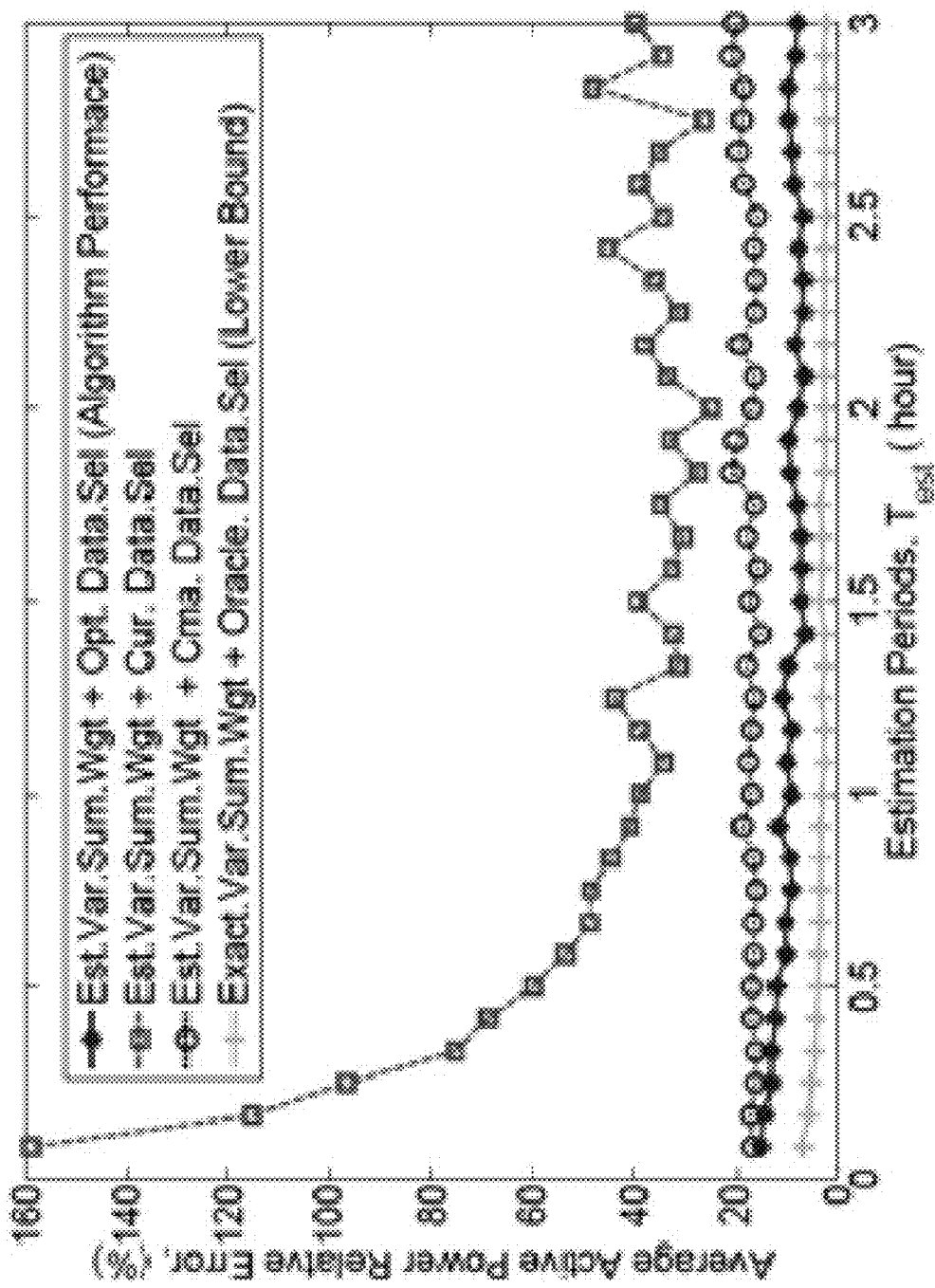

The relative error of average active power consumptions for each appliance is evaluated and related average values for specific estimation periods (e.g., $T_{est}$) can be computed—for example, analysis unit 130 can perform such evaluation and computation. In one aspect, as illustrated in FIGS. 13A-13C, the average relative error changes when the estimation periods are increased from 5 minutes to 3 hours at intervals of 5 minutes. In FIG. 13A, estimation performance of an exemplary implementation of a method for estimating consumption breakdowns (indicated with label Est.Var.Sum.Wgt+Opt.Data.Sel) is compared to a lower bound (indicated with label Exact.Var.Sum.Wgt+Oracle.Data.Sel).

The exemplary implementation yields results that convey average relative errors ranging from about 10% to about 15% for estimations periods ranging from 5 minutes to about 1 hour, and average relative errors ranging from about 6% to about 10% in an estimation period ranging from about 1 hour to about 3 hours. In one aspect, FIG. 13A illustrates that the average relative error can be reduced by nearly 30% or nearly 40% when the known exact variance (indicated with label Exact.Var.Sum.Wgt) or perfect data selection (indicated with label Oracle.Data.Sel) are employed. In another aspect, the average relative error can be further reduced by more than 50%, resulting in an average relative error of about 3% to about 7% if we estimation is performed with the known exact variance and perfect data selection, which is the performance bound of the various methods described herein.

The impact of weight matrix and data selection scheme on estimation performance are also illustrated in FIGS. 13B-13C. In one aspect, results presented in FIG. 13B convey that using weight scheme (b) (e.g., Unit Sum Matrix) or (a) (e.g., No Weight) can degrade estimation performance by a factor of about 3 to about 5. In another aspect, results displayed in FIG. 13C convey that the average relative error tends to rapidly decrease when data selection scheme (B) (or current dataset) is employed, whereas it slightly increases when data selection scheme (A) (or cumulative dataset) is employed for longer estimation periods. Note that the data selection scheme (A) (or cumulative dataset) exhibits similar performance with the predicted optimal dataset by the metric defined in Eq. (12) during the shorter estimation periods. It should be appreciated that an estimation performance gap among the estimates produced under such data selection schemes can be widened by nearly a factor of two for longer estimation periods.

Figure 14:
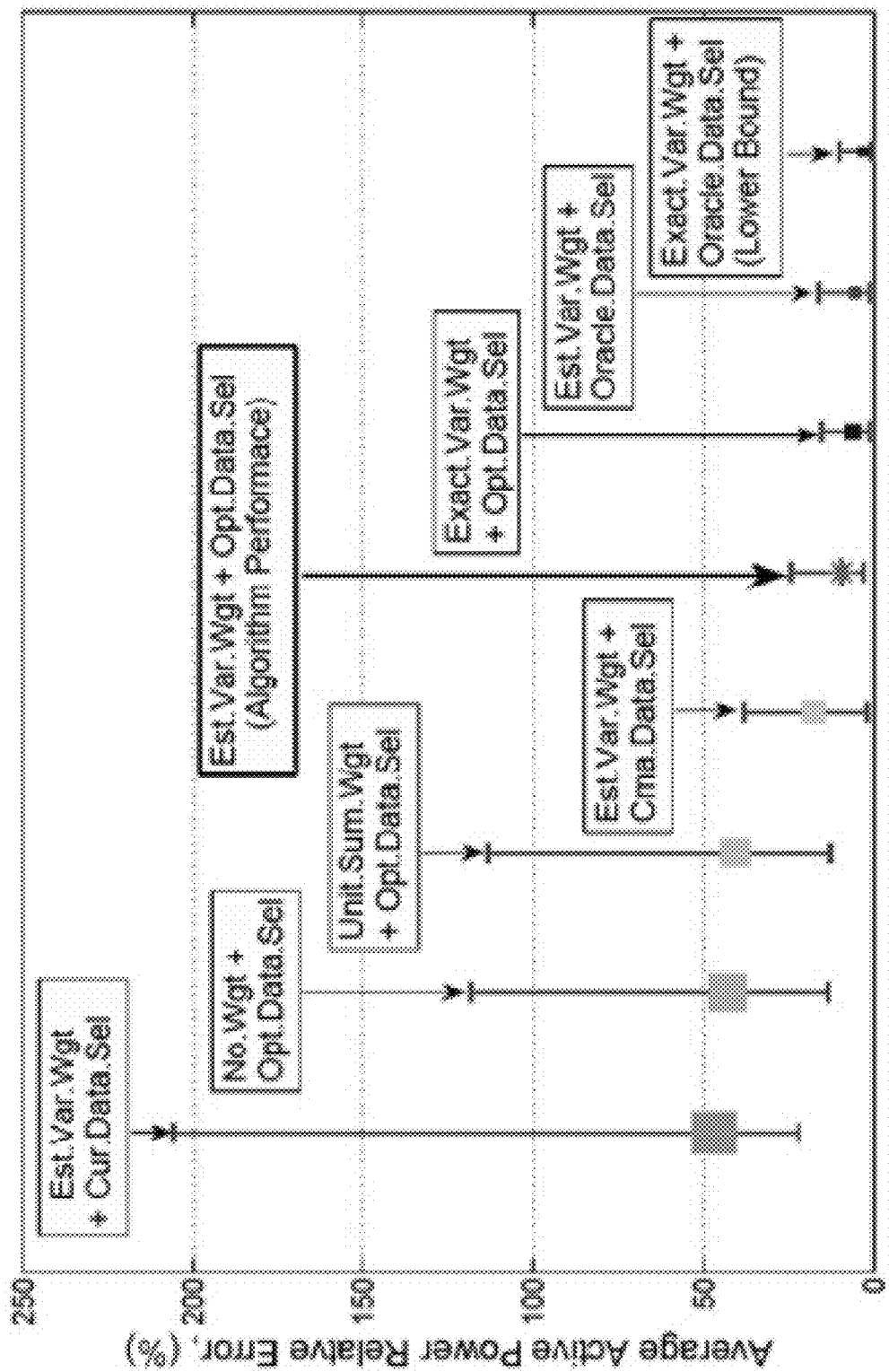
FIG. 14 displays maximum value, minimum value, and average value of relative error of active power consumption for several estimation periods with various combinations of weighting protocols and data selection schemes in accordance with aspects of the subject disclosure.

Table 6 and in FIG. 14 summarize results of relative error performance in accordance with aspects of the subject disclosure. Table 6 presents the average relative error for various estimation periods and appliances with various possible combinations of weight matrix and data selection schemes. In one aspect, implementation (e.g., execution) of the various methods for estimating consumption breakdowns described herein can yield average relative error of nearly 9.46%, which can be reduced to nearly 3.32% under idealized conditions. FIG. 14 presents the maximum values, minimum values, and average value of relative error in accordance with aspects of the subject disclosure. The worst case performance (e.g., the maximum relative error) is rapidly reduced by implementation of the various methods for estimating consumption breakdowns described herein, especially when compared to average relative error.

Exemplary Case Study 2: A large scale electricity network with electrical meter deployment.—In the subject exemplary case study, simulation results for implementation of the methods for estimating consumption breakdown disclosed herein are presented for a large scale electrical network in a building. In the simulation, in one aspect, ON and OFF events can be generated by a semi-Markov chain wherein each appliance independently remains either in ON state or OFF state for a random period of time according to an exponential probability distribution. In another aspect, a duty period and a duty cycle for each appliance can be generated independently accordingly to a uniform probability distribution in the intervals [1 hr, 6 hr] and [0,−1], respectively. In yet another aspect, to render the simulation realistic, power consumption profile data collected in measurements in exemplary case study 1 are employed. In one or more embodiments, analysis unit 130 or a component therein or otherwise functionally coupled thereto can perform (e.g., execute) such simulation.

In the simulation, the number of units in the building is increased from 1 to 9, contemplating that each unit has a set of 12 appliances randomly selected from the 12 appliances utilized in exemplary case study 1. Therefore, the total number of appliances in the electrical network in the building can increase from 12 to 108 in steps of 12 appliances. Consumption breakdown estimate are determined through the various methods disclosed herein in a scenario in which a single power meter is in the root node of a hierarchical tree representing the electrical network, for a data collection interval spanning 3 days with an estimation period spanning 1 hour. In certain implementations, the simulation is carried out 100 times at each increasing number of appliances (e.g., 12, 24, 48, 60, 72, 84, 96, 108). Generating various realizations of simulation results enables testing the methods of the subject disclosure for various sets of ON/OFF binary state event profiles. In such implementations, the average estimation performance over the number of appliances (or units in a building) is computed; analysis unit 130 can perform such computation.

Figure 15B:
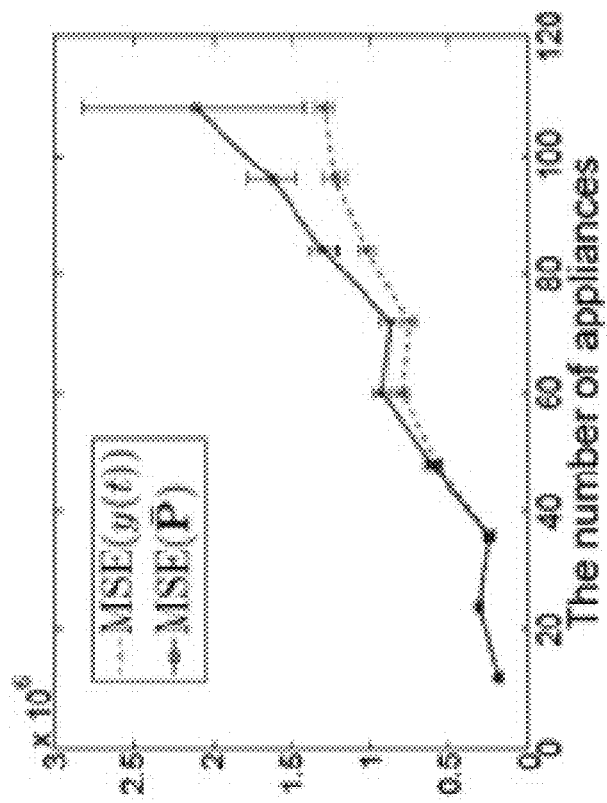
FIGS. 15A-15B illustrate performance evaluation with a single power meter for a large electrical network as a function of number of appliances in such network.
Figure 15A:
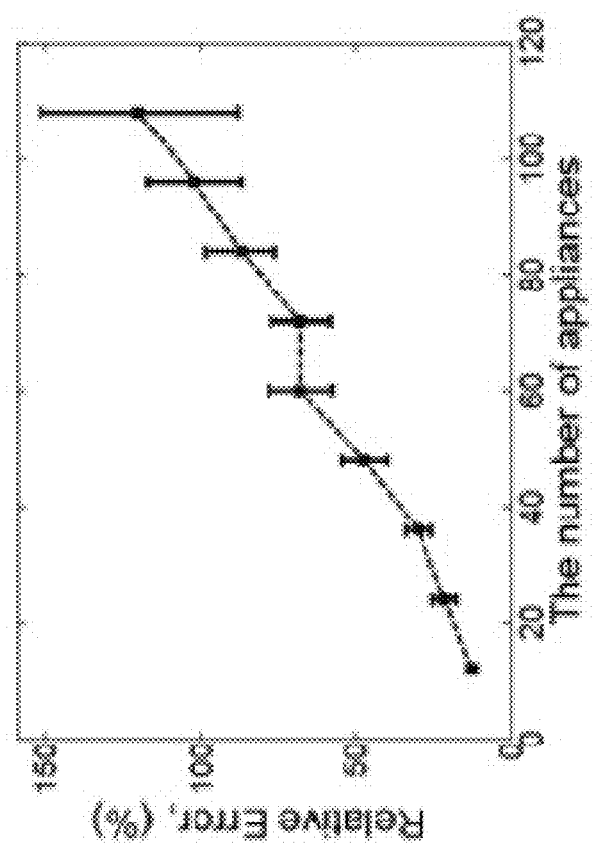

FIG. 15A presents the relative error of the average active power consumption in accordance with aspects of the subject disclosure. The relative error per appliance and its variance increases almost linearly with the number of appliances. In FIG. 15A the relative error reaches about 50% for 48 appliances and exceeds 100% for 96 appliances. In one implementation, as illustrated in FIG. 15B, MSE performance of the average active power consumption is evaluated, MSE($\bar{P}$) and the total power consumption MSE(y(t)) in FIG. 15B. Performance of MSE($\bar{P}$) is more affected than the MSE(y(t)) by the number of appliances. Without wishing to be bound by theory or modeling, it is believed that this is because the ON/OFF binary state sequences can be more likely correlated as the number of appliances increases. In another implementation, performance of the meter deployment algorithm also is evaluated for a building with 12 units where each unit has a set of randomly assigned 12 appliances, e.g., 144 appliances on the electrical network. Each unit is assumed to have one electrical outlet for meter deployment. Accordingly, the total number of power meters ranges from 1 to 13, including the power meter in the root node. We compare our deployment algorithm to a random deployment, which simply choose a random number of additional power meters from {0, 1, ..., 12} and randomly place them at electrical outlets. By default, at least one meter is in the root node.

Figure 16:
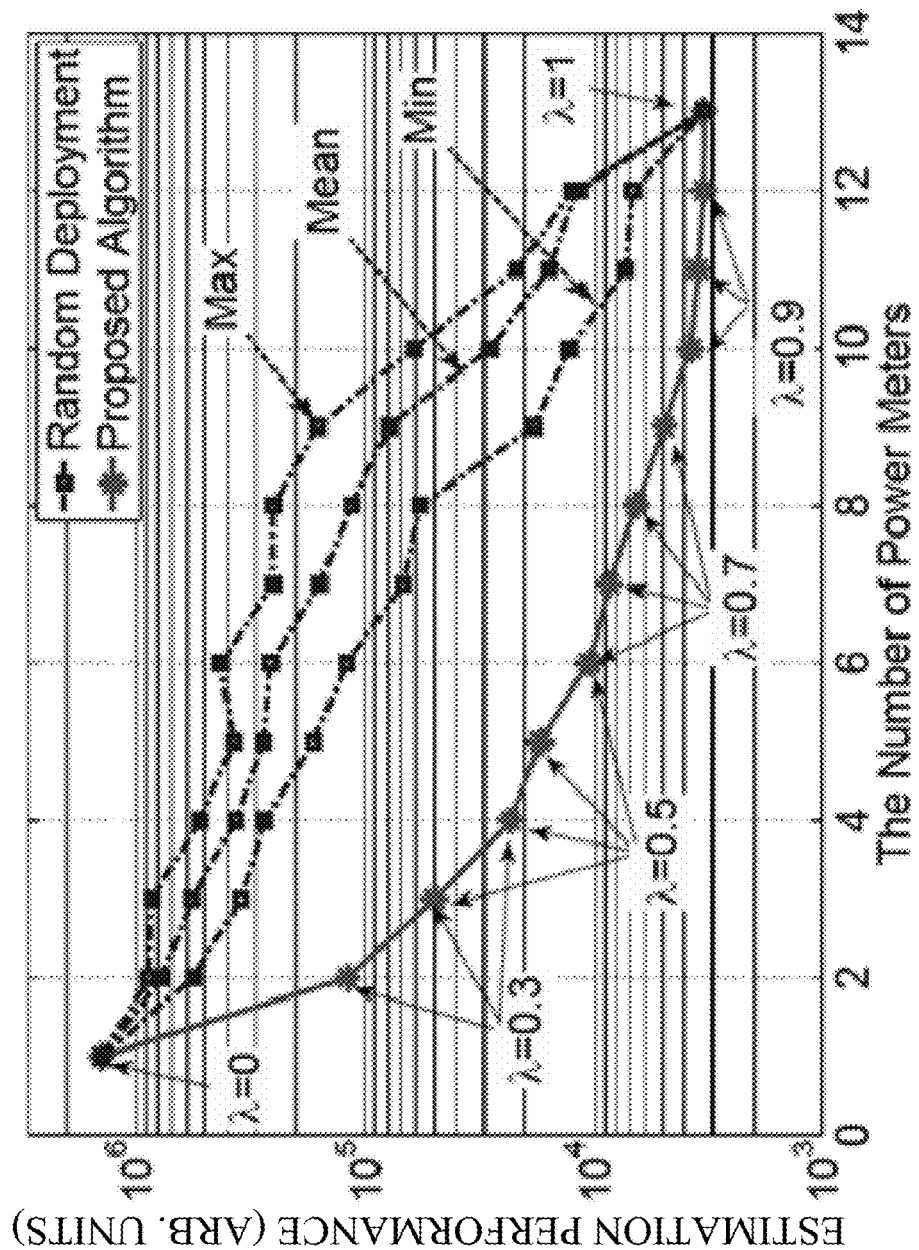
FIG. 16 illustrates performance of power meter incorporation into an electrical network in accordance with aspects of the subject disclosure.

In one implementation, a simulation including random deployment of power meter(s) is carried out for 1000 times. The number of power meters and resulting, corresponding estimation performance MSE($\bar{P}$) is presented in FIG. 16. For each number of power meters, the minimum value (indicated as "Min"), the average value (indicated as "Mean"), and the maximum value (indicated as "Max") of MSE($\bar{P}$) is presented in FIG. 16. In one aspect, shown results convey a clear trade-off between the number of power meters and the estimation performance with a large variance. The performance of a method for deploying additional power meters for improving consumption breakdown estimation quality as described herein is compared to performance of random deployment (solid square symbols in FIG. 16). The method is implemented (e.g., executed) with different weight coefficients $\lambda=\{0, 0.3, 0.5, 0.7, 0.9, 1\}$ in the cost function defined in Eq. (14). Analysis unit 130 or a component therein or otherwise functionally coupled thereto can implement the method.

In an implementation, for each weight coefficient value, we run the algorithm for 5 times. It shows a great improvement in trade-off compared to the random deployment. In one aspect, for a default value $\lambda=0.5$, the implementation of the method can yield deployment of 3 to 6 power meters in topologies that provide better estimation performance, by a factor of about 10, than random deployment of additional power meters. In another aspect, the implementation of the method can result in reduction of the number of power meters by 2 or 3 times when compared to the random deployment for substantially the same estimation performance. As described supra, for the two limiting cases in which $\lambda=0$ and $\lambda=1$ the algorithm deploys, respectively, no additional power meter and power meters in all outlets.

Figure 17A:
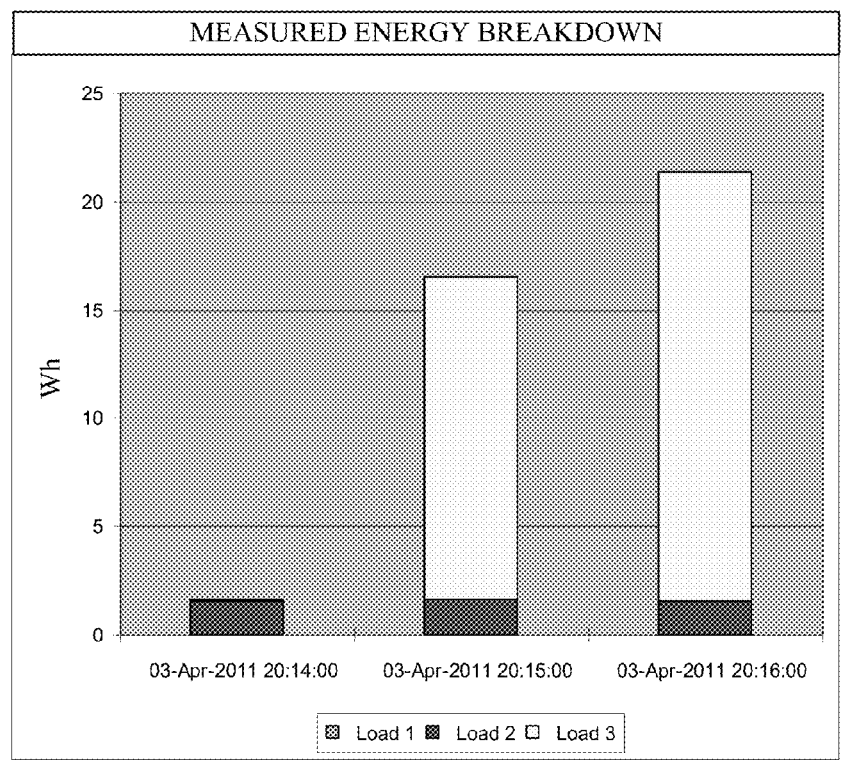
FIGS. 17A-17B illustrate, respectively, exemplary measured energy breakdown and exemplary estimated energy breakdown in accordance with aspects of the subject disclosure.
Figure 17B:
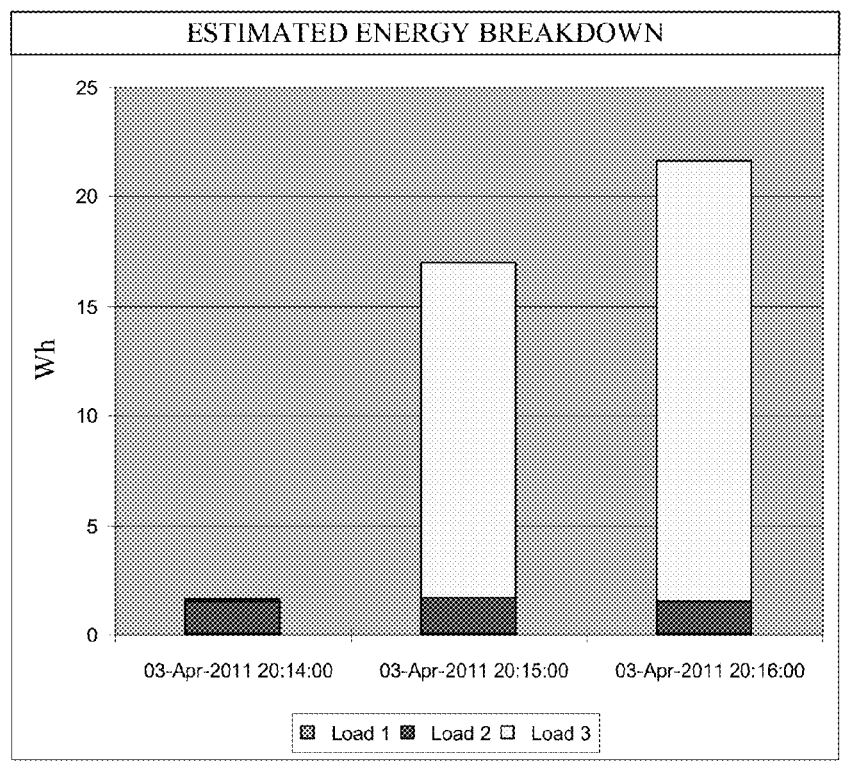

FIGS. 17A-17B illustrate, respectively, exemplary measured energy breakdown and exemplary estimated energy breakdown in accordance with aspects of the subject disclosure. Energy breakdowns are expressed in units of Watt-hour (Wh) and are measured and estimated for three exemplary loads: Load 1, a coffee maker; Load 2, desktop computer and monitor; and Load 3, portable fan forced heater. In an aspect, values of measured and estimated energy breakdown for Load 1 are substantially smaller that those for Load 2 and Load 3. A centralized power meter measures and supplies total power consumption of the three loads. In addition, in one aspect, measured energy breakdown is produced, in part, by three dedicated power meters respectively functionally coupled to the three loads. In another aspect, energy breakdowns are computed at the end of estimation period $T_{est}=60$ s; for power measurements, the sampling interval $T_s=1$ s. In yet another aspect, in the illustrated scenario, $k=3$ and thus three estimation periods are available, spanning a data collection time interval of 3 minutes. The illustrated estimation periods and data collection time intervals represent a portion of a larger data collection cycle and related estimation periods or time intervals. For the three estimated energy breakdowns and for each load (or appliance), respective relative errors, as defined hereinbefore, for example, can be computed. Optionally, a weighted relative error for the set of three loads (or appliances) can be computed. As an example, a weighed relative error can be computed, wherein the weighted relative error is the weighted average of relative errors (e.g., difference between the measured and the estimated energy consumption of a load divided by the measured energy consumption of the load). In certain embodiments, the weight is given according to the contribution of each load to the total energy consumption. In certain implementations, a weighted relative error $Wrel_\kappa$ for an estimation period $\kappa$ can be defined as $$Wrel_\kappa = 100 \times \sum_{l=1}^{N_{load}} \Delta_\kappa^{(l)},$$

$$\text{where } \Delta_\kappa^{(l)} = \frac{E_{\kappa,l}^{(actual)}}{\sum_{b=1}^{k} E_{b,l}^{(actual)}} \left| \frac{E_{\kappa,l}^{(estimated)} - E_{\kappa,l}^{(actual)}}{E_{\kappa,l}^{(actual)}} \right|,$$

with b being a natural number, l being a natural number indexing or labeling a load, $E_\kappa^{(actual)}$ being the ground truth value of energy consumption at estimation period $\kappa \leq k$, and $E_\kappa^{(estimated)}$ being an estimated value of the ground truth energy consuption. Computed weighted relative errors W$\Delta$ for the results presented in FIGS. 17A-17B are: 4.75% for the first estimation period, 3.08% for the second estimation period, and 1.65% for the third estimation period. Thus, for the data collected in the exemplary collection period, and more generally for data collected in longer data collection periods, the weighted relative error has an upper bound of about 5.0%.

Various advantages emerge from the features described in the subject disclosure. As an example, in certain embodiments, an advantage is good scaling of sensors and computational resources with the number of appliances. As another example, in certain embodiments, an advantage of incremental deployment algorithm for additional meters in large buildings can reduce the number of meters needed by two to three time when compared to a more random deployment approach. In addition, the various embodiments described herein can improve consumption breakdown estimation performance by about 10 times or can reduce the number of electricity meters by about 2 to about 3 times.

Figure 18:
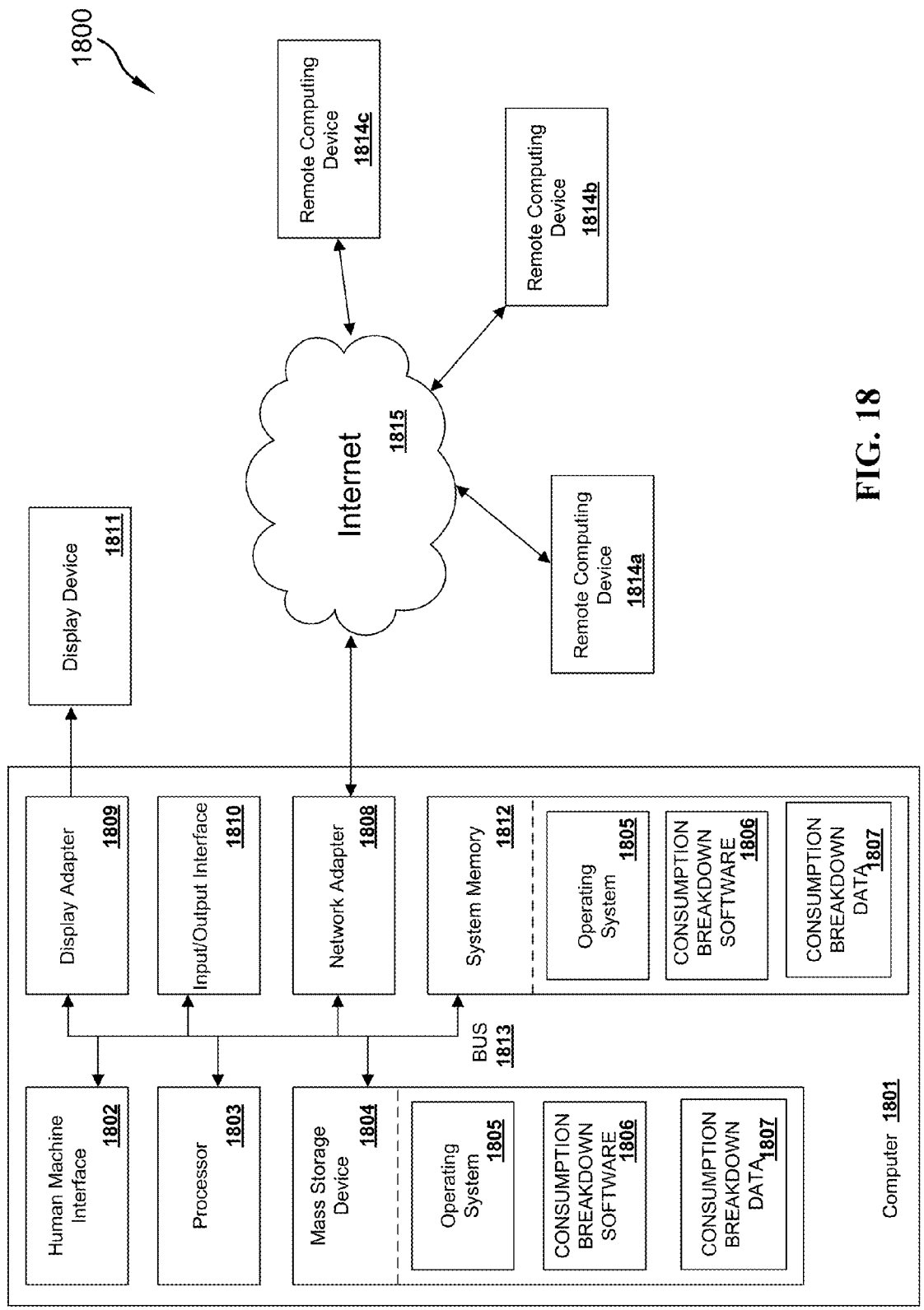
FIG. 18 illustrates a computing environment that enables various aspects of power breakdown monitoring through power state sensing in accordance with aspects described herein.

FIG. 18 illustrates a block diagram of an exemplary operating environment 1800 that enables various features of the subject disclosure and performance of the various methods disclosed herein. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The various embodiments of the subject disclosure can be operational with numerous other general purpose or special purpose computing system environments or configurations. Examples of well known computing systems, environments, and/or configurations that can be suitable for use with the systems and methods comprise, but are not limited to, personal computers, server computers, laptop devices or handheld devices, and multiprocessor systems. Additional examples comprise wearable devices, mobile devices, set top boxes, programmable consumer electronics, network PCs, minicomputers, mainframe computers, distributed computing environments that comprise any of the above systems or devices, and the like.

The processing effected in the disclosed systems and methods can be performed by software components. The disclosed systems and methods can be described in the general context of computer-executable instructions, such as program modules, being executed by one or more computers or other computing devices. Generally, program modules comprise computer code, routines, programs, objects, components, data structures, etc. that perform particular tasks or implement particular abstract data types. The disclosed methods also can be practiced in grid-based and distributed computing environments where tasks are performed by remote processing devices that are linked through a communications network. In a distributed computing environment, program modules can be located in both local and remote computer storage media including memory storage devices.

Further, one skilled in the art will appreciate that the systems and methods disclosed herein can be implemented via a general-purpose computing device in the form of a computer 1801. In one aspect, computer 1801 can embody analysis unit 130 described herein. The components of the computer 1801 can comprise, but are not limited to, one or more processors 1803, or processing units 1803, a system memory 1812, and a system bus 1813 that couples various system components including the processor 1803 to the system memory 1812. In the case of multiple processing units 1803, the system can utilize parallel computing. In a non-limiting exemplary embodiment, system memory 1812 can embody various computer-readable non-transitory media described herein.

In general, a processor 1803 or a processing unit 1803 refers to any computing processing unit or processing device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally or alternatively, a processor 1803 or processing unit 1803 can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors or processing units referred to herein can exploit nano-scale architectures such as, molecular and quantum-dot based transistors, switches and gates, in order to optimize space usage or enhance performance of the computing devices that can implement the various aspects of the subject disclosure. Processor 1803 or processing unit 1803 also can be implemented as a combination of computing processing units.

The system bus 1813 represents one or more of several possible types of bus structures, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 1813, and all buses specified in this description also can be implemented over a wired or wireless network connection and each of the subsystems, including the processor 1803, a mass storage device 1804, an operating system 1805, consumption breakdown software 1806, consumption breakdown data 1807, a network adapter 1808, system memory 1812, an Input/Output Interface 1810, a display adapter 1809, a display device 1811, and a human machine interface 1802, can be contained within one or more remote computing devices 1814a,b,c at physically separate locations, connected through buses of this form, in effect implementing a fully distributed system.

The computer 1801 typically comprises a variety of computer readable media. Exemplary readable media can be any available media that is accessible by the computer 1801 and comprises, for example and not meant to be limiting, both volatile and non-volatile media, removable and non-removable media. The system memory 1812 comprises computer readable media in the form of volatile memory, such as random access memory (RAM), and/or non-volatile memory, such as read only memory (ROM). The system memory 1812 typically contains data (such as a group of tokens employed for code buffers) and/or program modules such as operating system 1805 and consumption breakdown software 1806 that are immediately accessible to and/or are presently operated on by the processing unit 1803. Operating system 1805 can comprise OSs such as Windows operating system, Unix, Linux, Symbian, Android, iOS, Chromium, and substantially any operating system for wireless computing devices or tethered computing devices.

In another aspect, the computer 1801 also can comprise other removable/non-removable, volatile/non-volatile computer storage media. By way of example, FIG. 18 illustrates a mass storage device 1804 which can provide non-volatile storage of computer code, computer readable instructions, data structures, program modules, and other data for the computer 1801. For example and not meant to be limiting, a mass storage device 1804 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 1804, including by way of example, an operating system 1805, and consumption breakdown software 1806. Each of the operating system 1805 and consumption breakdown software 1806 (or some combination thereof) can comprise elements of the programming and the consumption breakdown software 1806. Data and code (e.g., computer-executable instruction(s)) can be retained as part of consumption breakdown software 1806 and can be stored on the mass storage device 1804. Consumption breakdown software 1806 and related consumption breakdown data 1807 can configure processor 1807 to perform the various steps, acts, or actions, described in the various embodiments of system(s) or method(s) set forth herein. Consumption breakdown software 1806, and related data and code, can be stored in any of one or more databases known in the art. Examples of such databases comprise, DB2®, Microsoft® Access, Microsoft® SQL Server, Oracle®, mySQL, PostgreSQL, and the like. Further examples include membase databases and flat file databases. The databases can be centralized or distributed across multiple systems.

In another aspect, the user can enter commands and information into the computer 1801 via an input device (not shown). Examples of such input devices comprise, but are not limited to, a camera; a keyboard; a pointing device (e.g., a "mouse"); a microphone; a joystick; a scanner (e.g., barcode scanner); a reader device such as a radiofrequency identification (RFID) readers or magnetic stripe readers; gesture-based input devices such as tactile input devices (e.g., touch screens, gloves and other body coverings or wearable devices), speech recognition devices, or natural interfaces; and the like. These and other input devices can be connected to the processing unit 1803 via a human machine interface 1802 that is coupled to the system bus 1813, but can be connected by other interface and bus structures, such as a parallel port, game port, an IEEE 1394 Port (also known as a Firewire port), a serial port, or a universal serial bus (USB).

In yet another aspect, a display device 1811 also can be connected to the system bus 1813 via an interface, such as a display adapter 1809. It is contemplated that the computer 1801 can have more than one display adapter 1809 and the computer 1801 can have more than one display device 1811. For example, a display device can be a monitor, an LCD (Liquid Crystal Display), or a projector. In addition to the display device 1811, other output peripheral devices can comprise components such as speakers (not shown) and a printer (not shown) which can be connected to the computer 1801 via Input/Output Interface 1810. Any step and/or result of the methods can be output in any form to an output device. Such output can be any form of visual representation, including, but not limited to, textual, graphical, animation, audio, tactile, and the like.

The computer 1801 can operate in a networked environment using logical connections to one or more remote computing devices 1814a,b,c. By way of example, a remote computing device can be a personal computer, portable computer, a mobile telephone, a server, a router, a network computer, a peer device or other common network node, and so on. Logical connections between the computer 1801 and a remote computing device 1814a,b,c can be made via a local area network (LAN) and a general wide area network (WAN). Such network connections can be through a network adapter 1808. A network adapter 1808 can be implemented in both wired and wireless environments. Such networking environments are conventional and commonplace in offices, enterprise-wide computer networks, intranets, and the Internet 1815. Networking environments generally can be embodied in wireline networks or wireless networks (e.g., cellular networks, such as Third Generation (3G) and Fourth Generation (4G) cellular networks, facility-based networks (femtocell, picocell, Wi-Fi networks, etc.).

As an illustration, application programs and other executable program components such as the operating system 1805 are illustrated herein as discrete blocks, although it is recognized that such programs and components reside at various times in different storage components of the computing device 1801, and are executed by the data processor(s) of the computer. An implementation of consumption breakdown software 1806 can be stored on or transmitted across some form of computer readable media. Any of the disclosed methods can be performed by computer readable instructions embodied on computer readable media. Computer readable media can be any available media that can he accessed by a computer. By way of example and not meant to be limiting, computer-readable media can comprise "computer storage media," or "computer-readable storage media," and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

Figure 19:
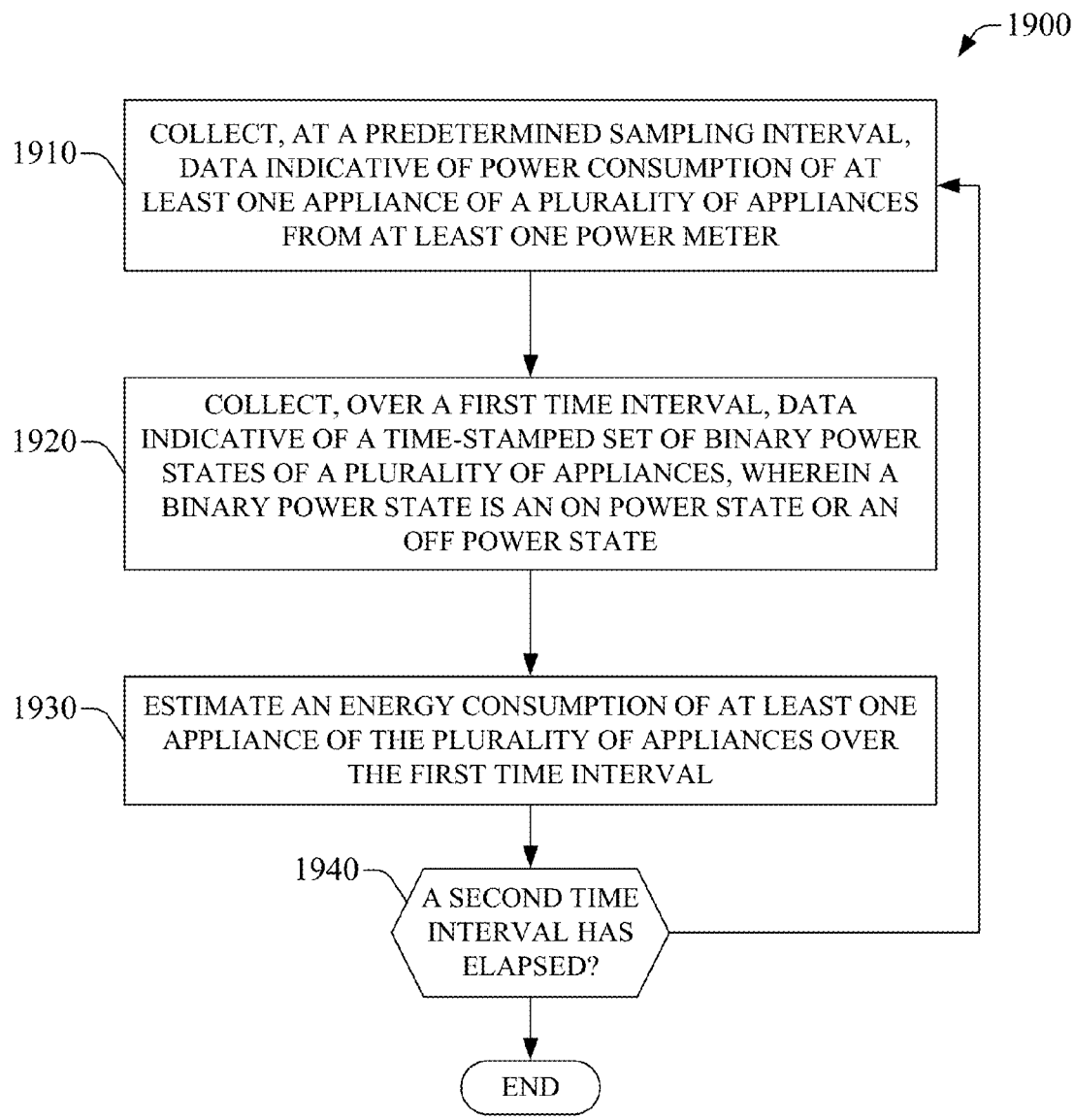
FIG. 19 illustrates an exemplary method for estimating consumption breakdown in accordance with aspects of the subject disclosure.

FIG. 19 is a flowchart of an exemplary method 1900 for estimating consumption breakdown in accordance with aspects of the subject disclosure. In certain embodiments, analysis unit 130 or a component therein or functionally coupled thereto can implement (e.g., execute) the subject example method. At step 1910, data indicative of power consumption of at least one appliance of a plurality of appliances from at least one power meter is collected at a predetermined sampling interval. In one aspect, as described herein, a number of power meters of the at least one power meter is less than a number of outlets of a plurality of outlets (e.g., see FIG. 2 or FIG. 5) coupled to the plurality of appliances. In one aspect, the power consumption of the at least one appliance of the plurality of appliances is a total power consumption of the plurality of power appliances. In another aspect, the at least one meter comprises a single power meter. At step 1920, data indicative of a time-stamped set of binary power states of a plurality of appliances is collected over a first time interval. In one aspect, as described herein, a binary power state is an ON power state or an OFF power state. At step 1930, energy consumption of at least one appliance of the plurality of appliances over the first time interval is estimated. The subject step is referred to as the estimating step. At step 1940, it is determined if a second time interval has elapse; the second time interval spanning a greater period of time than that spanned by the first time interval. In the affirmative scenario, flow is directed to step 1910 and steps 1910 through 1930 are repeated. Accordingly, during the second time interval, steps 1910-1930 are repeated.

In certain embodiments, the estimating step comprises estimating the energy consumption of each appliance of the plurality of appliances. In other embodiments, the estimating step comprises solving a weighted linear optimization problem within a three-tier tree structure representation of the plurality of appliances and the plurality of outlets coupled to the plurality of appliances. In addition, the estimating step can comprise generating a set of one or more weights, each weight of the set of one or more weights being equal to a number of state samples obtained in the predetermined time interval divided by a weighted sum of a plurality of variances of active power for respective appliances of the plurality of appliances.

In additional or alternative embodiments, the estimating step can comprise computing a first estimate of an average power consumption of the at least one appliance based on cumulative data collected over the second time interval. Moreover, the estimating step can comprise computing a second estimate of the average power consumption of the at least one appliance based on current data collected over the first time interval. Further, in such embodiments, the estimating step can comprise selecting one of the first estimate or the second estimate, based at least on an outcome of computing a mean square error for each appliance of the plurality of appliances for the first metric or the second metric. Further yet, in the additional or alternative embodiments, the estimating step can comprise estimating the energy consumption of the at least one appliance by multiplying a magnitude of a third time interval spanning the duration of an ON power state of the at least one appliance and one of the first estimate for the at least one appliance or the second estimate for the at least one appliance.

Figure 20:
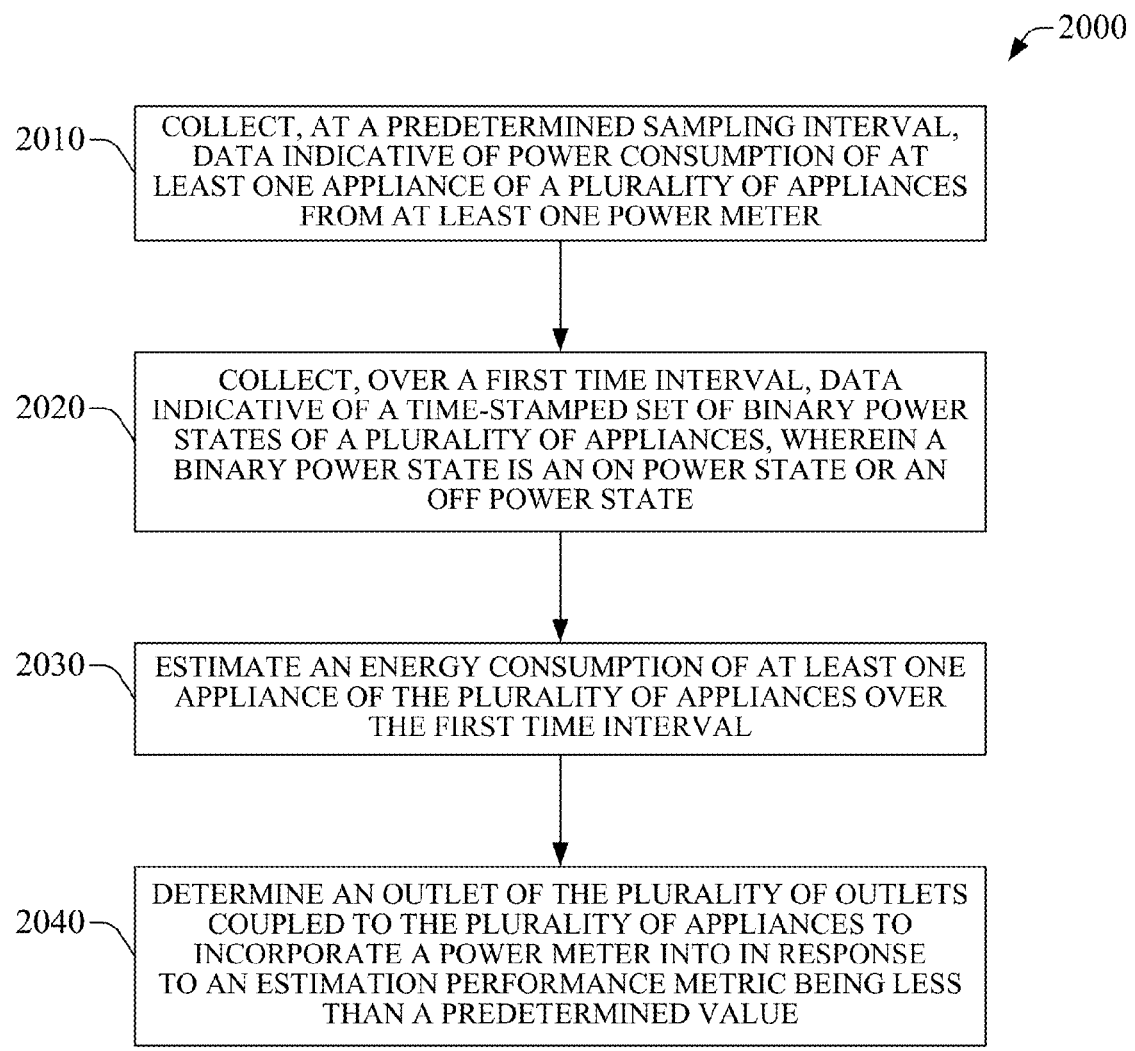
FIG. 20 illustrates an exemplary method for incorporating power meters in an electrical network as part of refinement of consumption breakdown estimation quality in accordance with aspects of the subject disclosure.

FIG. 20 is a flowchart of an exemplary method 2000 for incorporating power meters in an electrical network as part of refinement of consumption breakdown estimation quality in accordance with aspects of the subject disclosure. In certain embodiments, analysis unit 130 or a component therein or functionally coupled thereto can implement (e.g., execute) the subject example method. In the subject example method, steps 2010 through 2030 are substantially the same as steps 1910 through 1930 and thus are not expressly described herein. At step 2040, an outlet of the plurality of outlets coupled to the plurality of appliances as disclosed at step 2010 (or, similarly, step 1910) into which a power meter is to be incorporated in response to an estimation performance metric being less that a predetermined value is determined. The subject step is referred to as the determining step. In certain embodiments, the determining step can comprise minimizing a cost function (e.g., Eq. (14)) that quantifies a trade-off between estimation accuracy and number deployed power meters. As described herein, minimization can be accomplished through implementation of simulated annealing or other suitable formalism to find an extremum (e.g., a maximum or a minimum) in multivariate functions.

The various methods described herein (e.g., exemplary methods 1900 and 2000) can be encoded in computer-readable media as a set of computer-executable instructions. In one illustrative non-limiting embodiment, an exemplary computer-readable non-transitory medium can comprise: a first group of computer-executable instructions that, in response to execution, cause a processor to collect, at a predetermined sampling interval, data indicative of power consumption of at least one appliance of a plurality of appliances from at least one power meter, wherein a number of power meters of the at least one power meter is less than a number of outlets of a plurality of outlets coupled to the plurality of appliances; a second group of computer-executable instructions that, in response to execution, cause a processor to collect, over a predetermined time interval, data indicative of a time-stamped set of binary power states of a plurality of appliances, wherein a binary power state is an ON power state or an OFF power state; and a third group of computer-executable instructions that, in response to execution, cause the processor to estimate an average energy consumption of at least one appliance of the plurality of appliances over the predetermined time interval. In addition, the exemplary computer-readable non-transitory medium can comprise a fourth group of computer-executable instructions that, in response to execution, cause a processor to reiterate execution of the first group of computer-executable instructions, the second group of computer-executable instructions, and the third group of computer-executable instructions.

In various embodiments, the systems and methods of the subject disclosure for management and recovery of a monetary instrument can employ artificial intelligence (AI) techniques such as machine learning and iterative learning. Examples of such techniques include, but are not limited to, expert systems, case based reasoning, Bayesian networks, behavior based AI, neural networks, fuzzy systems, evolutionary computation (e.g., genetic algorithms), swarm intelligence (e.g., ant algorithms), and hybrid intelligent systems (e.g., Expert inference rules generated through a neural network or production rules from statistical learning).

In one aspect, and for purposes of simplicity of explanation, the exemplary methods disclosed herein are presented and described as a series of acts; however, it is to be understood and appreciated that the claimed subject matter is not limited by the order of acts, as some steps can occur in different orders and/or concurrently with other acts from that shown and described herein. For example, the various methods or processes of the subject disclosure can alternatively be represented as a series of interrelated states or events, such as in a state diagram. Moreover, when disparate functional elements implement disparate portions of the methods or processes in the subject disclosure, an interaction diagram or a call flow can represent such methods or processes. Furthermore, not all illustrated steps can be required to implement a method in accordance with the subject disclosure. Further yet, two or more of the disclosed methods or processes can be implemented in combination with each other, to accomplish one or more features or advantages herein described. It should be further appreciated that the exemplary methods disclosed throughout the subject specification can be stored on an article of manufacture, or computer-readable medium, to facilitate transporting and transferring such methods to computers for execution, and thus implementation, by a processor or for storage in a memory.

While the systems, devices, apparatuses, protocols, processes, and methods have been described in connection with exemplary embodiments and specific illustrations, it is not intended that the scope be limited to the particular embodiments set forth, as the embodiments herein are intended in all respects to be illustrative rather than restrictive.

Unless otherwise expressly stated, it is in no way intended that any protocol, procedure, process, or method set forth herein be construed as requiring that its acts or steps be performed in a specific order. Accordingly, in the subject specification, where description of a process or method does not actually recite an order to be followed by its acts or steps or it is not otherwise specifically recited in the claims or descriptions of the subject disclosure that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification or annexed drawings, or the like.

It will be apparent to those skilled in the art that various modifications and variations can be made in the subject disclosure without departing from the scope or spirit of the subject disclosure. Other embodiments of the subject disclosure will be apparent to those skilled in the art from consideration of the specification and practice of the subject disclosure as disclosed herein. It is intended that the specification and examples be considered as non-limiting illustrations only, with a true scope and spirit of the subject disclosure being indicated by the following claims.

What is claimed is:

1. A method, comprising:
    (i) collecting, by a processor, at a predetermined sampling interval, data indicative of power consumption of at least one appliance of a plurality of appliances from at least one power meter, wherein a number of power meters of the at least one power meter is less than a number of outlets of a plurality of outlets coupled to the plurality of appliances;

(ii) collecting, by the processor, over a first time interval, data indicative of a time-stamped set of binary power states of the plurality of appliances from a plurality of sensors, each sensor of the plurality of sensors being communicatively coupled to a respective appliance of the plurality of appliances; and (iii) estimating, by the processor, an average energy consumption of the at least one appliance of the plurality of appliances over the first time interval based on the data collected from the at least one power meter and the plurality of sensors.

2. The method of claim 1, further comprising repeating steps (i) through (iii) during a second time interval greater than the first time interval.

3. The method of claim 2, wherein the estimating step comprises computing a first estimate of an average power consumption of the at least one appliance based on cumulative data collected over the second time interval.

4. The method of claim 3, wherein the estimating step further comprises computing a second estimate of the average power consumption of the at least one appliance based on current data collected over the first time interval.

5. The method of claim 4, wherein the estimating step further comprises selecting one of the first estimate or the second estimate based at least on an outcome of computing a mean square error for each appliance of the plurality of appliances for the first metric or the second metric.

6. The method of claim 5, wherein the estimating step further comprises estimating the energy consumption of the at least one appliance by multiplying a magnitude of a third time interval spanning the duration of an ON power state of the at least one appliance and one of the first estimate for the at least one appliance or the second estimate for the at least one appliance.

7. The method of claim 1, wherein the estimating step comprises estimating the energy consumption of each appliance of the plurality of appliances.

8. The method of claim 1, wherein the power consumption of the at least one appliance of the plurality of appliances is a total power consumption of the plurality of appliances, and the at least one meter comprises a single power meter.

9. The method of claim 1, wherein the estimating step comprises solving a weighted linear optimization problem within a three-tier tree structure representation of the plurality of appliances and the plurality of outlets coupled to the plurality of appliances.

10. The method of claim 9, wherein the estimating step further comprises generating a set of one or more weights, each weight of the set of one or more weights being equal to a number of state samples obtained in the predetermined time interval divided by a weighted sum of a plurality of variances of active power for respective appliances of the plurality of appliances.

11. The method of claim 1, further comprising determining an outlet of the plurality of outlets coupled to the plurality of appliances to incorporate a power meter into in response to an estimation performance metric being less than a predetermined value.

12. The method of claim 11, wherein the determining step comprises minimizing a cost function that quantifies a trade-off between estimation accuracy and number of deployed power meters.

13. The method of claim 1, wherein a binary power state is an ON power state or an OFF power state.

14. A system, comprising:
a memory comprising data and computer-executable instructions; and a processor functionally coupled to the memory and configured by the computer-executable instructions to perform steps comprising:

(a) collecting, at a predetermined sampling interval, data indicative of power consumption of at least one appliance of a plurality of appliances from at least one power meter, wherein a number of power meters of the at least one power meter is less than a number of outlets of a plurality of outlets coupled to the plurality of appliances;

(b) collecting, over a first time interval, data indicative of a time-stamped set of binary power states of the plurality of appliances from a plurality of sensors, each sensor of the plurality of sensors being communicatively coupled to a respective appliance of the plurality of appliances; and (c) estimating an average energy consumption of the at least one appliance of the plurality of appliances over the first time interval based on the data collected from the at least one power meter and the plurality of sensors.

15. The system of claim 14, the processor is further configured to perform the step of determining an outlet of the plurality of outlets coupled to the plurality of appliances to incorporate a power meter into in response to an estimation performance metric being less than a predetermined value.

16. The system of claim 15, wherein the processor is further configured to perform the step of determining the outlet of the plurality of outlets, and wherein the processor is configured to minimize a cost function that quantifies a trade-off between estimation accuracy and number of deployed power meters.

17. The system of claim 14, wherein the processor is further configured to perform the step of repeating steps (a) through (c) during a second time interval greater than the first time interval.

18. The system of claim 17, wherein the processor is further configured to perform the step of computing a first estimate of an average power consumption of the at least one appliance based on cumulative data collected over the second time interval.

19. The system of claim 18, wherein the processor is further configured to perform the step of computing a second estimate of the average power consumption of the at least one appliance based on current data collected over the first time interval.

20. The system of claim 19, wherein the processor is further configured to perform the step of selecting one of the first estimate or the second estimate based at least on an outcome of computation of a mean square error for each appliance of the plurality of appliances for the first metric or the second metric.

21. The system of claim 20, wherein the processor is further configured to perform the step of estimating the energy consumption of the at least one appliance by multiplying a magnitude of a third time interval spanning the duration of an ON power state of the at least one appliance and one of the first estimate for the at least one appliance or the second estimate for the at least one appliance.

22. The system of claim 14, wherein the processor is further configured to estimate the energy consumption of each appliance of the plurality of appliances.

23. The system of claim 22, wherein the processor is further configured to perform the step of generating a set of one or more weights, each weight of the set of one or more weights being equal to a number of state samples obtained in the predetermined time interval divided by a weighted sum of a plurality of variances of active power for respective appliances of the plurality of appliances.

24. The system of claim 14, wherein the power consumption of the at least one appliance of the plurality of appliances is a total power consumption of the plurality of appliances, and the at least one meter comprises a single power meter.

25. The system of claim 14, wherein the processor is further configured to perform the step of solving a weighted linear optimization problem within a three-tier representation of the plurality of appliances and the plurality of outlets coupled thereto.

26. The system of claim 14, wherein a binary power state is an ON power state or an OFF power state.

27. A computer-readable non-transitory medium, comprising:
- a first group of computer-executable instructions that, in response to execution, cause a processor to collect, at a predetermined sampling interval, data indicative of power consumption of at least one appliance of a plurality of appliances from at least one power meter, wherein a number of power meters of the at least one power meter is less than a number of outlets of a plurality of outlets coupled to the plurality of appliances;
- a second group of computer-executable instructions that, in response to execution, cause the processor to collect, over a predetermined time interval, data indicative of a time-stamped set of binary power states of the plurality of appliances from a plurality of sensors, each sensor of the plurality of sensors being communicatively coupled to a respective appliance of the plurality of appliances; and
- a third group of computer-executable instructions that, in response to execution, cause the processor to estimate an average energy consumption of the at least one appliance of the plurality of appliances over the predetermined time interval based on the data collected from the at least one power meter and the plurality of sensors.

28. The computer-readable non-transitory medium of claim 27, further comprising a fourth group of computer-executable instructions that, in response to execution, cause the processor to reiterate execution of the first group of computer-executable instructions, the second group of computer-executable instructions, and the third group of computer-executable instructions.

29. The computer-readable non-transitory medium of claim 27, wherein a binary power state is an ON power state or an OFF power state.

* * * * *